United States Patent
Carlson

(10) Patent No.: US 8,456,331 B2
(45) Date of Patent: Jun. 4, 2013

(54) SYSTEM AND METHOD OF COMPRESSION AND DECOMPRESSION

(75) Inventor: David A. Carlson, Haslet, TX (US)

(73) Assignee: Cavium, Inc., San Jose, CA (US)

( * ) Notice: Subject to any disclaimer, the term of this patent is extended or adjusted under 35 U.S.C. 154(b) by 122 days.

(21) Appl. No.: 13/087,817

(22) Filed: Apr. 15, 2011

(65) Prior Publication Data

US 2012/0262314 A1   Oct. 18, 2012

(51) Int. Cl.
*H03M 7/34* (2006.01)

(52) U.S. Cl.
USPC ............. 341/51; 375/240; 375/372; 375/377; 709/219; 370/331; 455/436; 455/438; 713/1; 713/2; 707/769; 707/810; 700/292; 700/293

(58) Field of Classification Search
USPC ........................ 341/50–70; 375/240, 372, 377; 709/219–331; 713/1, 2; 711/113; 370/331; 445/436, 438; 455/436, 438
See application file for complete search history.

(56) References Cited

U.S. PATENT DOCUMENTS

| | | | |
|---|---|---|---|
| 4,558,302 A | 12/1985 | Welch | |
| 4,906,991 A | 3/1990 | Fiala et al. | |
| 5,142,282 A | 8/1992 | Tobin et al. | |
| 5,281,967 A | 1/1994 | Jung | |
| 5,463,390 A | 10/1995 | Whiting et al. | |
| 5,506,580 A | 4/1996 | Whiting et al. | |
| 5,532,694 A | 7/1996 | Mayers et al. | |
| 7,051,126 B1* | 5/2006 | Franklin | 710/68 |
| 7,260,217 B1 | 8/2007 | Carlson | |
| 7,353,233 B1* | 4/2008 | Ganca | 375/E7.144 |
| 7,403,136 B2 | 7/2008 | De La Cruz et al. | |
| 7,454,418 B1* | 11/2008 | Wang | 707/999.006 |
| 7,538,695 B2 | 5/2009 | Laker et al. | |
| 7,650,040 B2 | 1/2010 | Ghildiyal | |
| 7,764,205 B2 | 7/2010 | Owsley et al. | |
| 7,870,161 B2* | 1/2011 | Wang | 707/801 |
| 8,325,069 B2* | 12/2012 | Gopal et al. | 341/51 |
| 2012/0262314 A1 | 10/2012 | Carlson | |

OTHER PUBLICATIONS

Huffman, David A., "A Method for the Construction of Minimum-Redundancy Codes," *Proceedings of the I.R.E.*, pp. 1098-1101, Sep. 1952.

Ziv, Jacob, et al., "A Universal Algorithm for Sequential Data Compression," IEEE Trans. Inform. Theory, vol. IT-23, No. 3, pp. 337-343, 1977.

"Data Compression Method-Adaptive Coding with Sliding Window for Information Interchange," American National Standards Institute, ANSI X3.241, pp. 1-8, Aug. 1994.

L. Peter Deutsch, DEFLATE Compressed Data Format Specification version 1.3, Internet RFC 1951, pp. 1-15, May 1996.

"The BIG-IIP System With Intelligent Compression: Cutting Application Delivery Time and Optimizing Bandwith", F5 Networks, Inc., pp. 1-7, Aug. 2005.

* cited by examiner

*Primary Examiner* — Lam T Mai
(74) *Attorney, Agent, or Firm* — Hamilton, Brook, Smith & Reynolds, P.C.

(57) ABSTRACT

The disclosure relates to a system and a method for hardware encoding and decoding according to the Limpel Ziv STAC (LZS) and Deflate protocols based upon a configuration bit.

20 Claims, 20 Drawing Sheets

| 1408g | 1408h | 1408i | 1408j |
|---|---|---|---|
| Code | Extra Bits | Length | Payload |
| 257 | 0 | 3 | 7 |
| 258 | 0 | 4 | 7 |
| 259 | 0 | 5 | 7 |
| 260 | 0 | 6 | 7 |
| 261 | 0 | 7 | 7 |
| 262 | 0 | 8 | 7 |
| 263 | 0 | 9 | 7 |
| 264 | 0 | 10 | 7 |

1408k

| 1408g | 1408h | 1408i | 1408j |
|---|---|---|---|
| Code | Extra Bits | Length | Payload |
| 265 | 1 | 11,12 | 8 |
| 266 | 1 | 13,14 | 8 |
| 267 | 1 | 15,16 | 8 |
| 268 | 1 | 17,18 | 8 |
| 269 | 2 | 19-22 | 9 |
| 270 | 2 | 23-26 | 9 |
| 271 | 2 | 27-30 | 9 |
| 272 | 2 | 31-34 | 9 |

1408l

| 1408g | 1408h | 1408i | 1408j |
|---|---|---|---|
| Code | Extra Bits | Length | Payload |
| 273 | 3 | 35-42 | 10 |
| 274 | 3 | 43-50 | 10 |
| 275 | 3 | 51-58 | 10 |
| 276 | 3 | 59-66 | 10 |
| 277 | 4 | 67-82 | 11 |
| 278 | 4 | 83-98 | 11 |
| 279 | 4 | 99-114 | 11 |

1408m

| 1410g | 1410h | 1410i | 1410j |
|---|---|---|---|
| Code | Extra Bits | Length | Payload |
| 280 | 4 | 115-130 | 12 |
| 281 | 5 | 131-162 | 13 |

1410k

| 1410g | 1410h | 1410i | 1410j |
|---|---|---|---|
| Code | Extra Bits | Length | Payload |
| 282 | 5 | 163-194 | 13 |
| 283 | 5 | 195-226 | 13 |

1410l

| 1410g | 1410h | 1410i | 1410j |
|---|---|---|---|
| Code | Extra Bits | Length | Payload |
| 284 | 5 | 227-257 | 13 |
| 285 | 0 | 258 | 8 |

1410m

| 1414g | 1414h | 1414i | 1414j |
|---|---|---|---|
| Code | Extra Bits | Distance | Payload |
| 0 | 0 | 1 | 5 |
| 1 | 0 | 2 | 5 |
| 2 | 0 | 3 | 5 |
| 3 | 0 | 4 | 5 |
| 4 | 1 | 5,6 | 6 |
| 5 | 1 | 7,8 | 6 |
| 6 | 2 | 9-12 | 7 |
| 7 | 2 | 13-16 | 7 |
| 8 | 3 | 17-24 | 8 |
| 9 | 3 | 25-32 | 8 |

1414k

| 1414g | 1414h | 1414i | 1414j |
|---|---|---|---|
| Code | Extra Bits | Distance | Payload |
| 10 | 4 | 33-48 | 9 |
| 11 | 4 | 49-64 | 9 |
| 12 | 5 | 65-96 | 10 |
| 13 | 5 | 97-128 | 10 |
| 14 | 6 | 129-192 | 11 |
| 15 | 6 | 193-256 | 11 |
| 16 | 7 | 257-384 | 12 |
| 17 | 7 | 385-512 | 12 |
| 18 | 8 | 513-768 | 13 |
| 19 | 8 | 769-1024 | 13 |

1414l

| 1414g | 1414h | 1414i | 1414j |
|---|---|---|---|
| Code | Extra Bits | Distance | Payload |
| 20 | 9 | 1025-1536 | 14 |
| 21 | 9 | 1537-2048 | 14 |
| 22 | 10 | 2049-3072 | 15 |
| 23 | 10 | 3073-4096 | 15 |
| 24 | 11 | 4097-6144 | 16 |
| 25 | 11 | 6145-8192 | 16 |
| 26 | 12 | 8193-12288 | 17 |
| 27 | 12 | 12289-16384 | 17 |
| 28 | 13 | 16385-24576 | 18 |
| 29 | 13 | 24577-32768 | 18 |

| Code | # of Bits | Length | Payload |
|---|---|---|---|
| 2b'00 | 2 | 2 | 2 |
| 2b'01 | 2 | 3 | 2 |
| 2b'10 | 2 | 4 | 2 |
| 2b'1100 | 4 | 5 | 4 |
| 2b'1101 | 4 | 6 | 4 |
| 2b'1110 | 4 | 7 | 4 |
| 2b'11110000 | 8 | 8 | 8 |
| 2b'11110001 | 8 | 9 | 8 |
| 2b'11110010 | 8 | 10 | 8 |
| 2b'11110011 | 8 | 11 | 8 |
| 2b'11110100 | 8 | 12 | 8 |

1512d

| Code | # of Bits | Length | Payload |
|---|---|---|---|
| 2b'11110101 | 4 | 13 | 4 |
| 2b'11110110 | 4 | 14 | 4 |
| 2b'11110111 | 8 | 15 | 8 |
| 2b'11111000 | 8 | 16 | 8 |
| 2b'11111001 | 8 | 17 | 8 |
| 2b'11111010 | 8 | 18 | 8 |
| 2b'11111011 | 8 | 19 | 8 |
| 2b'11111100 | 8 | 20 | 8 |
| 2b'11111101 | 8 | 21 | 8 |
| 2b'11111110 | 8 | 22 | 8 |
| 2b'11111111 | 8 | more | 8 |

SYSTEM AND METHOD OF COMPRESSION AND DECOMPRESSION

BACKGROUND

Limpel Ziv STAC (LZS) and Deflate are compression protocols based on the Lempel-Ziv algorithm. Compression generally works by finding repeated sequences of data in the prior output sequences. When repeating sequences are found, a description of the repeating sequence can be sent in substitute of a literal representation of the sequence. The sequence can be represented further with symbols that minimize the size of the sequence, such as representing the literal and description of the repeating sequences of data with symbols of varying length, wherein sequences of data that appears more frequently are matched with shorter bit length symbols to minimize their size. Decompression generally works in reverse of compression. During decompression, a stream of symbols representing literal and repeating sequences of data are translated back to its non-coded form and the repeating sequence data are expanded to the original literal representations.

Within the Deflate protocol and the LZS protocol, the description of the repeating sequence is referred to as a string, which consists of length parameter and a distance parameter. In the Deflate protocol, the length parameter is specified to be between 3 to 258 bytes. The distance parameter is specified to be between 1 to 32,767 bytes. If no repeating sequence is found, then a literal, generally expressed as a byte, is sent. In addition to finding repeating sequences, the Deflate protocol utilizes Huffman encoding symbols to represent the literal and repeating sequences of data. The Huffman encoding scheme substitutes frequently appearing strings and literals with smaller numbers of bits; infrequently appearing strings and literals are substituted with larger numbers of bits. The Deflate protocol supports optimally generated Huffman symbols and standardized fixed Huffman symbols. In optimal Huffman encoding, optimally generated Huffman symbols are dynamically generated for the string and literals and an optimal Huffman coded dictionary is created to be provided with the encoded data stream to allow for its translation. In fixed Huffman encoding, the symbols are defined in the standard. Thus, although the encoding may be suboptimal as the bit-length for the symbols are not optimally customized to the frequency distribution of strings and literals, there is a saving in not having to transmit the coded dictionary as with optimal Huffman encoding.

The LZS protocol works similarly to the Deflate protocol. The differences between the LZS protocol and the Deflate protocol are in the search boundaries. For example, the history window for the LZS protocol is 2 kilobytes, but is 32 kilobytes for the Deflate protocol. As a result, the LZS protocol supports a string distances of 1 to 2,047 bytes, whereas the Deflate protocol supports a string distance of 1 to 32,767 bytes. The LZS protocol supports a string length of 2 to infinite bytes, whereas the Deflate protocol supports a string length of 3 to 258 bytes. Another difference between LZS and Deflate is the symbols used to substitute for the string and literal parameters. The LZS protocol utilizes a fixed set of codes defined in the LZS standard, whereas the Deflate protocol utilizes Huffman, optimal and fixed, codes.

The LZS protocol is defined in the *American National Standard for Information System* ANSI® X3.241-1994, title "Data Compression Method—Adaptive Coding with Sliding Window for Information Interchange." This document is referenced herein and is incorporated into this Application in its entirety.

The Deflate protocol standard is defined in the *Network Working Group* Request for Comments 1951, Deflate Compressed Data Format Specification Version 1.3. This document is referenced herein and is incorporated into this Application in its entirety. It should be appreciated that the term "Deflate" generally refers to a compression process and the term "Inflate" refers to the decompression process of a data stream encoded using the Deflate process.

Although the LZS and Deflate protocols are based on the Lempel-Ziv algorithm, due to the differences between the LZS and Deflate protocols, the protocols are generally implemented independently, which increases the size and cost of the compression and decompression systems that implement them. Additionally, string parameters within the LZS and Deflate protocol have overlapping bit-patterns, which requires extra hardware to address. For example, within the Deflate protocol for fixed Huffman codes, at least 5 bits of the length and distance codes overlap.

Since LZS and Deflate protocol have common bit patterns within the defined code standard, such as between length and distance parameters or between string and literal parameters, it is not contemplated that all the search codes will be utilized concurrently.

Combining the hardware generally results in degradation in performance in having the system interrupted in switching between the overlapping string parameters.

SUMMARY

The disclosure is directed towards a system and a method that can share common circuitries to decrease the physical size of a chip for a compression engine and decompression engine.

The system and method further provides a decoding system that can decode string parameters without interruption in having non-overlapping bit-patterns of string parameters loaded into a single search array, thus reducing the frequency of loading the search codes into the search field. The consolidation of the search elements further reduces the number of overhead circuitries and other redundancies in the decompression circuit associated with having multiple search arrays, thus resulting in reduced manufacturing and design costs and improved performance.

The illustrative embodiment of a decompression engine comprises an ingress port configured to receive an input data stream and a decoder configuration bit; and a decoder configured to decode the data stream according to one of a Lempel Ziv STAC (LZS) protocol and a Deflate protocol based upon the decoder configuration bit. The decoder comprises a memory storing a plurality of search symbols and a decoded value, the search symbols derived from the LZS protocol and the Deflate protocol. The decode values are associated with the plurality of search symbols and includes a plurality of length parameters, a plurality of distance parameters, and a plurality of literal values. The decoder further comprises a plurality of search elements simultaneously comparing a portion of the input data stream to a portion of the search symbols to cause the output of one of the decoded values upon a match, the portion of search symbols selected to be compared to the portion of the input data stream is based upon the decoder configuration bit.

The decoder may further comprise a state machine determining the decoded value to output upon a match, the state machine using the matched search symbol and another portion of the input data stream determined from the matched search symbol to determine the decoded value. Each search element may comprise a comparison circuit, a search buffer, and a payload data. The payload data may alternatively be located in the state machine.

Each of the plurality of search elements may have an index number, the decompression engine outputs the decoded value based upon the index number of the matched search element. The decoder may comprise a Huffman decoder configured to decode a dynamic Huffman code dictionary from a portion of the input data stream, the decoded dynamic Huffman code dictionary stored as the plurality of search symbols and the plurality of decoded values. The search elements may be tertiary content addressable memories (TCAM). The plurality of search elements may comprise a search array and a binary marker is appended to the portion of the input data stream being compared to the search elements, the binary marker differentiating the search elements within the search array. The plurality of search elements may be configured to simultaneously compare at least twenty-two of the length values when decoding according to the LZS protocol. The plurality of search elements may comprise comparison states, including a binary high, a binary low, and a don't care state.

During decoding, a distinguishing marker is appended to the portion of the input data stream being compared; the marker is appended based on the decoding state of the state machine.

The search array is adapted to simultaneously compare one of the possible 22 length values, 256 literal values, and 2,048 distance values according to the LZS protocol. The search array is adapted to simultaneously compare at least one of the possible 256 literal values, 258 length values, and 32,768 distance values according to the Deflate protocol in a single comparison cycle. The search array comprises 320 search elements, each search element having at least a 16-bit search buffer. The search element can be a tertiary content addressable memory (TCAM) adapted to compare three comparison states for each bit, including a binary high, a binary low, and a "Don't Care" state. TCAM may be configured with a fourth state, "Don't match" or Disabled.

The illustrative embodiment is further a method comprising receiving an input data stream having a plurality of input symbols and decoding the input data stream according to at least one of a Lempel Ziv STAC (LZS) protocol and a Deflate data protocol based upon a decoder configuration bit.

In an embodiment, the method further comprises loading a plurality of search symbols and decoded values, the search symbols derived from the LZS protocol and the Deflate protocol, the decode values associated with the plurality of search symbols, including a plurality of length parameters, a plurality of distance parameters, and a plurality of literal values; and comparing simultaneously a portion of the input data stream to a portion of the search symbols to cause the decompression engine to output one of the decoded values upon a match, the portion of search symbols loaded to be compared to the portion of the input data stream based upon the decoder configuration bit.

In an embodiment, the method further comprises determining the decoded value to output upon a match using the matched search symbol and another portion of the input data stream determined from the matched search symbol to determine the decoded value.

In an embodiment, at least twenty-two length values are compared simultaneously to a portion of the input data stream when decoding according to LZS.

In an embodiment, a plurality of search elements compare simultaneously the portion of the input data stream to the portion of the search symbols is performed a plurality of search elements. The search element may comprise a comparison circuit, a search buffer, and a payload data. The search elements may be tertiary content addressable memory (TCAM). The search elements have an index number, the index number of the matched search element is utilized to output the decoded values.

In an embodiment, the method further comprises appending a binary marker to the portion of the input data stream being compared to the search elements, the binary marker differentiating the search elements within the search array.

In an illustrative embodiment, a data compression engine comprises an input port receiving an input data stream; a search engine determining at least one of a repetitive pattern and a non-repetitive pattern from the input data stream, the search engine outputting a string representing the repetitive pattern and a literal character representing the non-repetitive pattern; and an encoder engine receiving the literal character and the string, the encoder encoding the literal character and the string according to one of a Lempel Ziv STAC (LZS) protocol and a Deflate protocol.

BRIEF DESCRIPTION OF THE DRAWINGS

The foregoing will be apparent from the following more particular description of example embodiments of the disclosure, as illustrated in the accompanying drawings in which like reference characters refer to the same parts throughout the different views. The drawings are not necessarily to scale, emphasis instead being placed upon illustrating embodiments of the present disclosure.

FIG. 14C is a diagram of yet another portion of the fixed Huffman search codes loaded into the search array when decoding according to the Deflate protocol in accordance with the illustrative embodiment;

FIG. 15C is a diagram of yet another portion of the LZS search codes loaded into the search array when decoding according to the LZS protocol in accordance with the illustrative embodiment.

DETAILED DESCRIPTION

A description of example embodiments of the disclosure follows.

Figure 1:
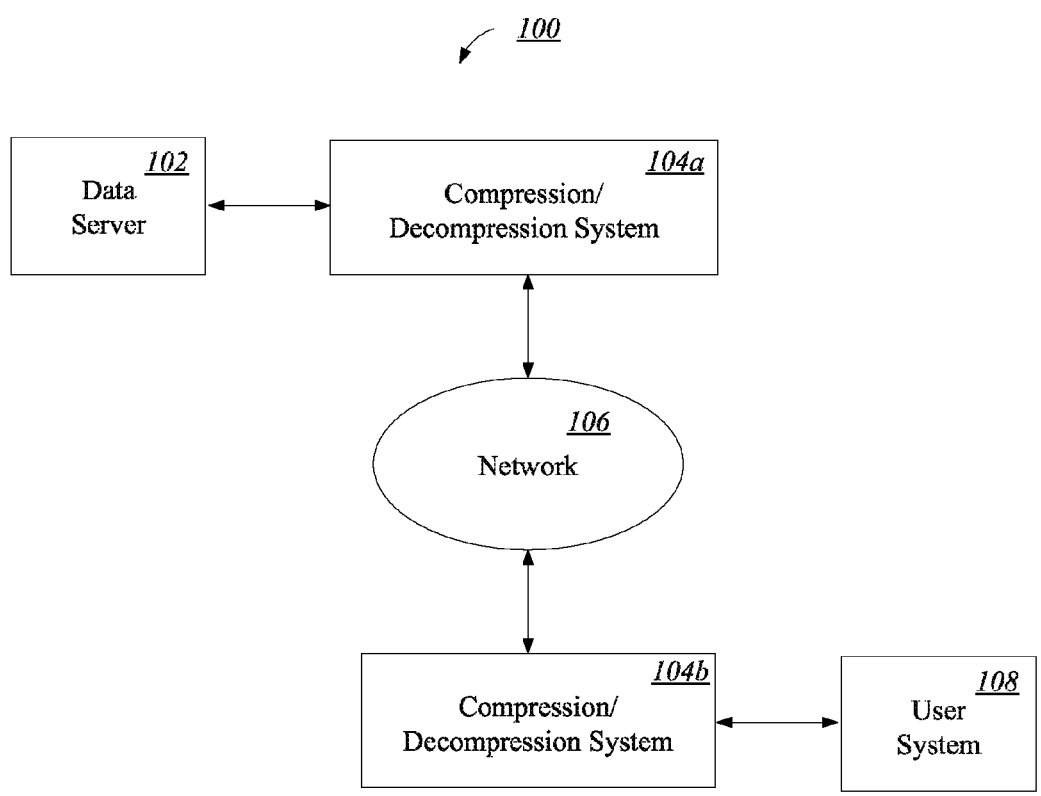
FIG. 1 is a high level overview of a compression and decompression scenario in accordance with the illustrative embodiment.

FIG. 1 is a high level overview of a compression and decompression scenario in accordance with the illustrative embodiment. The scenario 100 comprises a data server 102, a compression/decompression system 104, a network 106, a compression/decompression system 104b, and a user system 108.

Two scenarios are shown within scenario 100. In the first scenario, the data server 102 contains data intended for use by the user system 108. The data server 102 sends the data to the compression system 104a. The compression system 104a encodes the data prior to transmitting the encoded data to the network 106. A decompression system 104b receives the encoded data from the network 106. The decompression system 104b decodes the data and provides the data to the user system 108.

Conversely, in the second scenario, the user system 108 has data that is to be sent to the data server 102. The user system 108 sends the data to the compression system 104b. The compression system 104b compresses the data prior to it being sent to the network 106. The decompression system 104a receives the data from the network 106. The decompression system 104a decodes the data and provides the data to the data server 102.

The scenario 100 describes typical use-cases in a communication network scenario. The scenario may be utilized on various levels of network, such as SONET, asynchronous transfer mode communication, IPV6, IPV4, and etc.

In alternative embodiments, the scenario 100 is a data storage scenario where data server 102 comprises data storage modules that are used for data storage of the data of user system 108.

The user system 108 may include other networks, other servers, personal computers, as well as mobile devices. Mobile devices may include cell phones, mobile phones, electronic book readers, video game consoles and other handheld devices.

Figure 2:
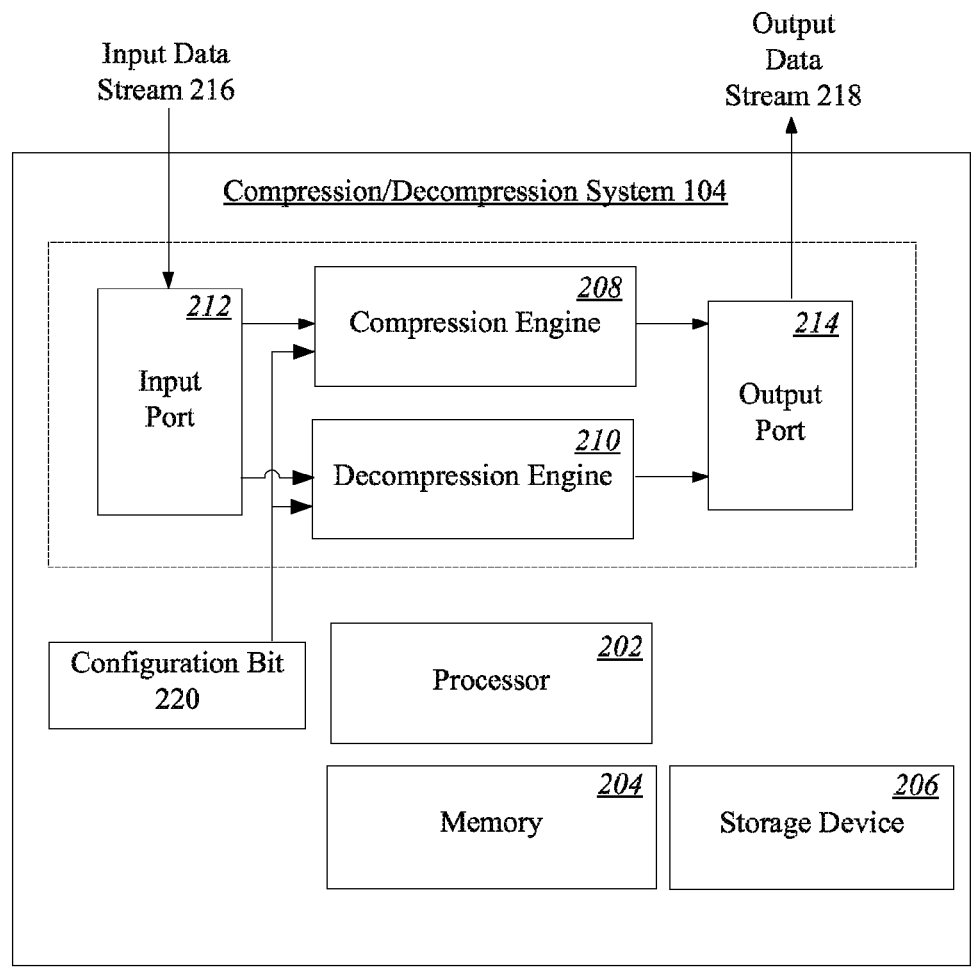
FIG. 2 is a diagram of a compression and decompression system in accordance with the illustrative embodiment.

FIG. 2 is a diagram of a compression and decompression system in accordance with the illustrative embodiment. In FIG. 2, the compression and decompression system 104 comprises a processor 202, a memory 204, and a storage device 206, a compression engine 208, a decompression engine 210, an input port 212, and an output port 214. An input data stream 216 is received by the input port 212. The input port 212 directs the input data stream, if a raw uncompressed form, to the compression engine 208. Wherein the input data stream is an encoded data stream, the input port 212 directs the input data stream to the decompression engine 210. The compression engine 208 encodes and decompression engine 210 decodes the input data stream according to the protocols selected by a configuration bit 220.

In a scenario where the input data stream is a raw data stream, the input port 212 provides the raw data stream to the compression engine 208. The compression engine 208 encodes the raw data stream in accordance to the Deflate and the LZS protocol according to a user defined input. The encoded decompression engine 208 outputs an encoded data stream to the output port 214 which is presented as output data stream 218.

In a scenario where compressed encoded data stream is received as input data stream 216, the input port 212 receives the compressed data stream and provides it to the decompression engine 210. The decompression engine 210 decodes the encoded data stream according to the LZS protocol or the Deflate protocol. The decompression engine is instructed on the protocol that is presented in the encoded data stream. The decompression engine 210 decodes the encoded data stream into an uncompressed data stream that is provided to the output port 214 which is outputted as the output data stream 218.

The processor 202 provides control services to the compression and decompression engines. The processor can operate applications that provide a graphical user interface to provide control inputs to the compression/decompression engine. The processor may further include various mechanisms to report the operation of the compression and decompression engine to the user. The term 'processor' refers to a device that is capable of processing data. The processor 202 may comprise an electronic circuit or electronic circuits implementing the required functionality, and/or a microprocessor or microprocessors running a computer program implementing the required functionality. When designing the implementation, a person skilled in the art will consider the requirements set for the size and power consumption of the apparatus 700, the necessary processing capacity, production costs, and production volumes, for example. The electronic circuit may comprise logic components, standard integrated circuits, application-specific integrated circuits (ASIC), and/or other suitable electronic structures.

In alternate embodiments, input port 212 and output port 214 are dynamic memory access (DMA) interfaces. In such scenario, the processor 202 operates in cooperation with the DMA interface. Memory 204 is generally random access memory (RAM). Data storage 206 is generally a hard drive or solid state storage device that is used to store the system application instructions and data.

Compression System and Method

Figure 3:
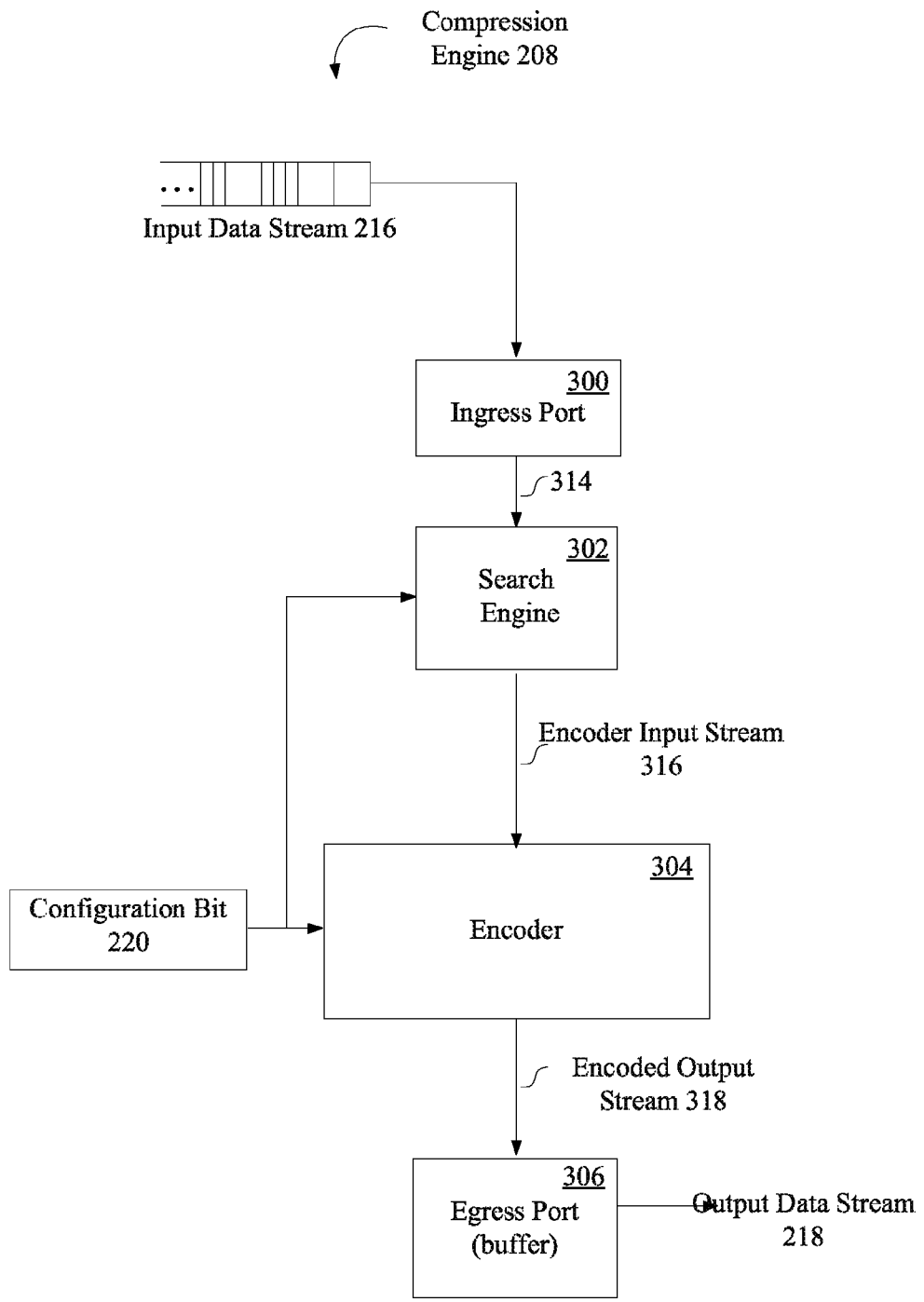
FIG. 3 is a diagram of a compression engine in accordance with the illustrative embodiment.
Figure 8:
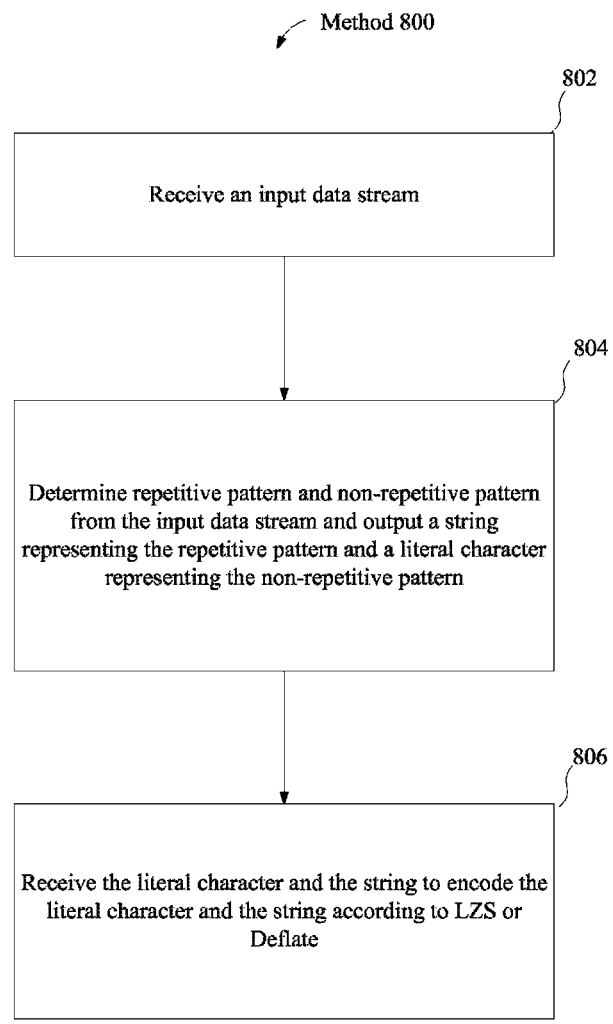
FIG. 8 is a flow chart of a compression method in accordance with the illustrative embodiment.

Methods of encoding and apparatus embodiments thereof are now described with reference to FIG. 3 and FIG. 8. FIG. 3 is a diagram of a compression engine in accordance with the illustrative embodiment. FIG. 8 is a flow chart of a compression method 800 in accordance with the illustrative embodiment.

The compression engine 208 comprises an ingress port 300, a search engine 302, an encoder engine 304, and an egress port 306. The compression engine 208 receives an input data stream 308 to provide an output encoded stream 312 based upon a configuration bit 220.

The compression method 800 initiates with the ingress port 300 receiving an input data stream (block 802). The ingress port 300 partitions the input data stream 308 into blocked data stream 314 and provides the blocked data stream to the search engine 302.

The search engine 302 determines a repetitive pattern and a non-repetitive pattern from the input data stream 308 and outputs a string representing the repetitive pattern and a literal character representing the non-repetitive pattern (block 804). The search engine 302 stores the blocked data stream 314 in a memory module therein. The search engine 302 indexes the blocked data stream 314 and stores the index information in a hash table. The search engine 302 uses the indexed information to assess potential string matches within the input data stream 308. At a current byte position in the input data stream 308, the search engine 302 receives potential string matches by accessing the hash table; the search engine compares the potential string matches to the blocked data stored within the memory. Upon a match, the search engine 302 outputs a string value representative of a length and a distance value of the repetitive pattern. The search engine 302 outputs a literal if no match greater than a minimum length, specified within the protocol standard, is found. Within LZS encoding, the minimum matched length is 2, whereas the minimum matched length within Deflate encoding is 3. The searching parameters may be specified with longer minimum matched length parameters. The search engine 302 searches for repeating string and provides the repeating results to the encode engine 304.

The search engine 302 reconfigures circuitries between LZS and Deflate encoding. The parameters of the search engine are changed for the selected protocol, such as the searching window. For example, under Deflate encoding, potential string matches extending more than 32 KB from the current position are ignored. Similarly, under LZS encoding, potential string matches extending more than 2 KB from the current position are ignored. The search engine also limits the length output of found repeating sequences to 258 bytes within Deflate and infinite byte within LZS. The search engine 220 limits an LZS string between 2 and 4096 bytes.

The encoder engine 304 receives the literal character and the string to encode the literal character and the string according to the LZS or Deflate protocol (block 806). The literal and string characters comprise the output data stream 312. The encoder engine 304 receives the literal or the string 316 from the search engine 302. The encoder engine 304 encodes the literal and string 316 into encoded symbols 318 by substituting the literal and string 316 with encoded symbols. The encoded symbols used are dependent on the configuration bit 220.

The configuration bit 220 instructs the encoder to encode the provided string and literal output with encoded symbols either according to the LZS or the Deflate protocol. In the illustrative embodiment, the configuration bit 220 is a single bit parameter specifying the protocol, LZS or Deflate, to be performed. The configuration bit 220 may be a bit sequence. It should be appreciated that other encoding protocol are contemplated to be utilized with the encoder described herein. In the illustrative embodiment, the configuration bit 220 is a user-defined parameter. In alternate embodiments, the configuration bit 220 may specify the encoder to determine the optimal protocol to use; the optimal protocol producing the shortest length output.

Encoded symbols and codes are binary bit sequences of varying length that are generally unique among each other. The LZS protocol encodes uses varying-bit symbols established within the LZS protocol standard. The Deflate protocol uses Huffman symbols, which are variable-length codes derived based upon the frequency distribution of occurrence of the string and literals. The LZS and Huffman protocols have codes that are common between length and distance parameters or between string and literal parameters.

The egress port 306 receives the encoded output 318 from the encoder engine 304. The egress port 306 buffers the encoded symbol 318 to form an output encoded stream 312.

Figure 4:
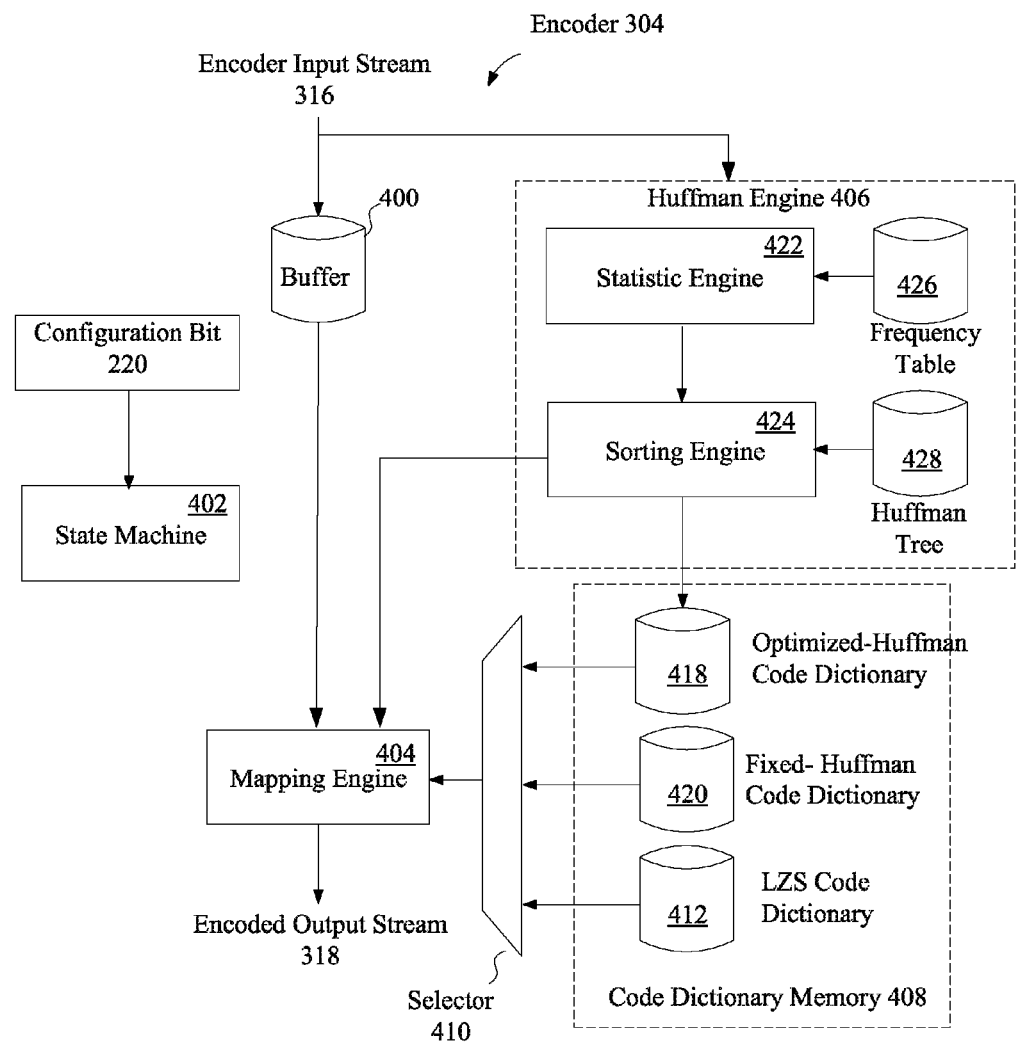
FIG. 4 is a diagram of an encoder engine of the compression engine of FIG. 3 in accordance with the illustrative embodiment.

An encoding system is now discussed with reference to FIG. 4. FIG. 4 is a diagram of the encoder engine of FIG. 3 in accordance with the illustrative embodiment.

The encoder engine 304 comprises a buffer 400, a state machine 402, a mapping engine 404, a Huffman engine 406, a code dictionary memory 408, and a selector 410.

The buffer 400 receives and stores an input stream 308. The state machine 402 receives a configuration bit 220 and configures to encode according to the LZS or the Deflate protocol based upon the configuration bit 220. The mapping engine 404 translates the input stream of literal and strings within encoder input stream 316 into a stream of symbols within an encoded output stream 318. The selector 410 selects a code dictionary for the encoding based upon the configuration bit 220. The code dictionary includes LZS code dictionary 412, optimized Huffman code dictionary 418, and fixed Huffman code dictionary 420.

The state machine 402 orchestrates the operation of the encoder engine 304. In the illustrative embodiment, when encoding a Huffman data stream, the state machine 402 maintains at least three states, including an initialization state, a buffering state, and an output state. In the initialization state, the encoder 304 is initialized or reconfigured to an initial starting state for encoding. In the buffering state, the encoder 304 receives the encoder input stream 316 and stores the stream 316 in the buffer 400. As the buffer 400 is buffering the strings and literal values in the incoming encoder input stream 316, the Huffman engine 406 determines the frequency distribution of string and literal values. When the buffer 400 is full, the mapping engine 404 is triggered to output the encoded output stream 312. When encoding according to the Deflate protocol, the encoder 304 determines the shorter output stream between using fixed Huffman and Optimal Huffman code dictionaries when the buffer 400 is full and select the code dictionary to be utilized. Then, in the output state, the mapping engine 404 outputs the encoded output stream 312 using the selected code dictionary. When encoding according to the LZS protocol, when the buffer 400 is full, the mapping engine 404 initiate outputting the encoded output stream 318 as only one LZS coded dictionary is utilized for the encoding.

LZS Encoding

Encoding according to the LZS protocol is now described with reference to FIG. 4, FIG. 7C. FIG. 7C is a diagram of a LZS encoded data stream 728.

The state machine 402 initializes and determines from the configuration bit 220 to perform LZS encoding. The LZS literal and string codes are part of code dictionary 412 stored in the dictionary memory 408. The LZS code dictionary 412 is loaded into the mapping engine 404.

The buffer 400 receives a stream of literal and strings as encoder input stream 316 and stores the stream therein. The size of buffer 400 determines the number of literals and strings to be included in the output symbol stream 416. When the buffer 400 is full, the encoder 304 is triggered to output the encoded output stream 312.

The mapping engine 404 receives the stream of literal and strings from the buffer 400 and substitutes the bytes of literal and string values with symbols from the LZS code dictionary 412 and appends it to the encoded output stream 318. The translation comprises substituting the input literal or string with a bit-pattern for the literal and string defined by the LZS protocol to output an encoded output stream 318.

Upon the end of the encoding (indicated by the buffer 400 being empty), the state machine 402 provides a "done status" within the system memory, which is presented to the user.

The mapping engine 404 generates a LZS encoded data stream as shown in FIG. 7C. The mapping engine 404 outputs a literal or a string data block until the buffer 400 is empty.

LZS encoded data stream 728 comprises a plurality of repeating data block 736 and an end marker 730. The repeating data block 736 comprises literal codes, a length codes, and a distance codes, which are 9-bit, 2-bit to infinite-bit, and 9-bit to 13-bit, respectively. The repeating data block 736 comprises either a literal code (732) or a distance code (732) follows by length code (734) that may be repeating.

The end marker 730 is a 9-bit pattern having the binary value "1 1000 000", as defined within Section 5.7 of ANSI X3.241-1994. The end marker 730 marks the end of the encoded data stream 728.

The distance code is a variable length bit pattern that represents the distance or offset (in bytes) from the first byte of the matching pattern to the first byte of the source pattern, defined in Section 5.5 of ANSI X3.241-1994. The minimum value of the distance parameter is "1" and the maximum value is "2047". The distance codes comprise either an 8-bit pattern or a 12-bit pattern. In the illustrative embodiment, the distances codes are loaded into the search array 604 either as a 9-bit pattern or a 13-bit pattern as a result of the inclusion of header information of the LZS code.

The length code is a variable-length bit pattern that represents the lengths (in bytes) of the matching pattern, defined in Section 5.6 of ANSI X3.241-1994. The minimum value of the length value is 2 and the maximum value is infinite; however, in the illustrative embodiment, the maximum value of the length value is bounded to 2048. Value of the length parameter greater than 4 and less than or equal to 7 is represented by a 4-bit pattern, wherein bit3 and bit4 are "1" and bit 1 and bit 2 are the binary value of length −5. Value of the length parameter greater than 7 is represented by multiples 4-bit pattern, wherein the 4-bit pattern is "1111". The number of 4-bit pattern is ((length-8)15)+1. The multiples 4-bit patterns are followed by a 4-bit pattern of the binary value of the remainder of the division operation.

Deflate Encoding

Figure 9:
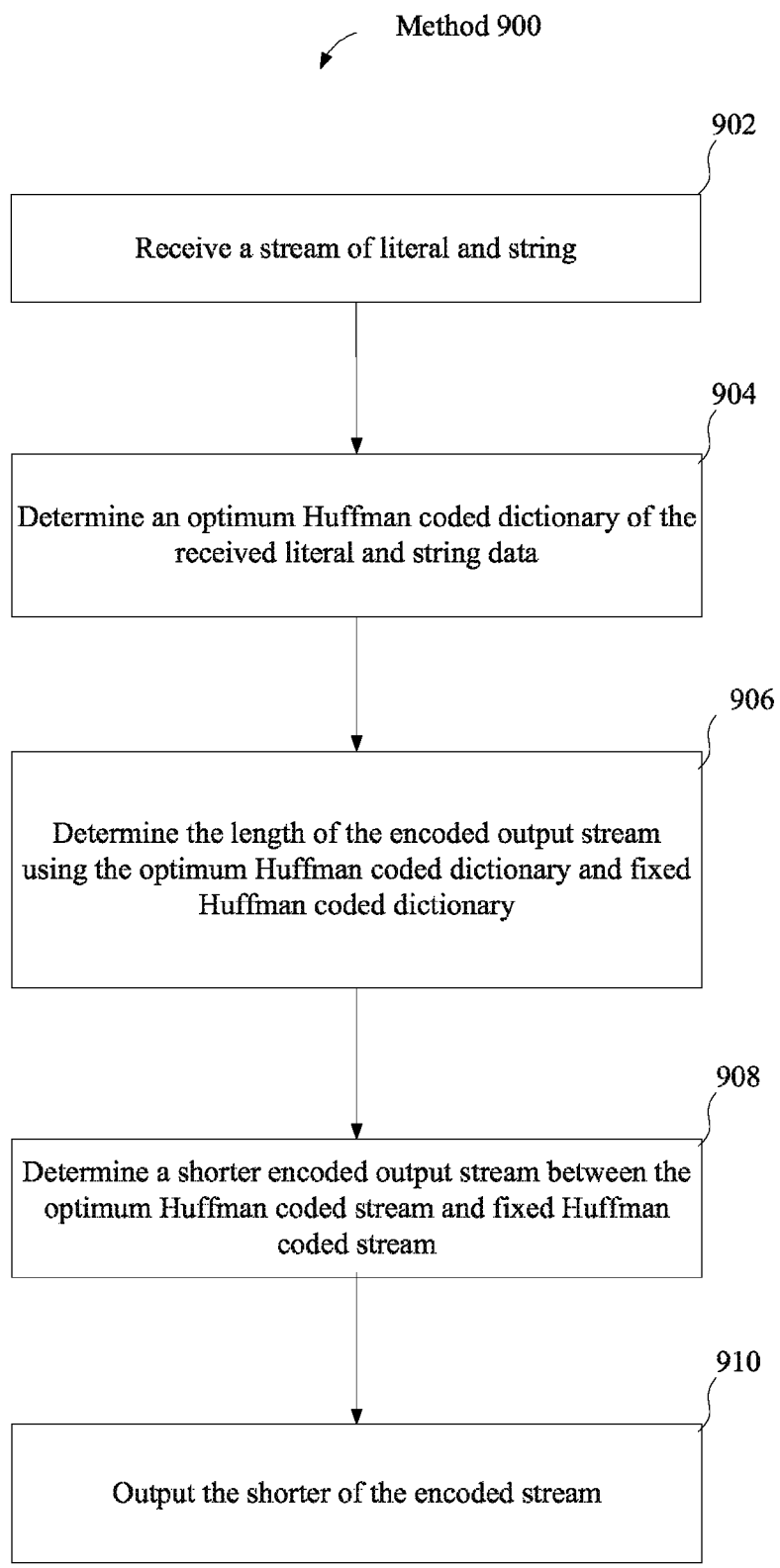
FIG. 9 is a flow chart of a compression method using optimal Huffman coding in accordance with the illustrative embodiment.

The method and system for encoding according to the Deflate protocol is now described with reference to FIG. 4 and FIG. 9. FIG. 9 is a flow chart of a compression method 900 using optimal Huffman coding in accordance with the illustrative embodiment.

The encoder 304 reuses circuitries, including the buffer 400, the state machine 402, the mapping 404, the code dictionary memory 408, and the selector 410 when encoding according to the Deflate protocol.

The state machine 402 initializes by examining the configuration bit 220.

Upon initialization, the buffer 400 receives a stream of literal and strings and stores the stream therein (block 902).

The Huffman engine 406 determines an optimal Huffman coded dictionary for the received literal and string data (block 904) for Deflate encoding. The Huffman engine 406 comprises a statistics engine 422, and a sorting engine 424.

The statistic engine 422 provides a frequency count of the literal and string inputs 316 received from the buffer 400. The statistics engine 422 comprises a plurality of counters configured to increment upon receipt of a literal, distance, or length value. A frequency table 426 maintains the counter values. The frequency count is used to determine the length of the dynamic Huffman symbols, which is used to calculate the total length of the encoded dynamic data stream.

The sorting engine 424 uses the frequency data within the frequency table 426 to determine the optimal variable bit length assigned to the literal and strings. Conventional Huffman tree calculation is utilized.

When the buffer 400 is full, the sorting engine 424 ranks the literal and string inputs 316 according to the histogram of the information as is stored in the frequency table 426. The sorting engine 424 calculates the actual symbol for the optimal Huffman code. The symbols are aggregated together to form an optimal Huffman code dictionary which are stored in the optimal Huffman code dictionary 418 in code dictionary memory 408. It should be appreciated, that the determination of a Huffman tree is known in the art and various Huffman and other encoding methods may be utilized. The sorting engine 424 ranks the literal and string accordingly to their frequency and maps the most frequent literal and strings to the shortest Huffman variable length symbol converter. The frequency of the literal and strings are multiplied by variable bit length of the corresponding Huffman symbol to determine the size of the optimal encoded steam.

The state machine 402 determines the length of the encoded output stream 318 using the optimum Huffman coded dictionary and fixed Huffman coded dictionary (block 906). The state machine 402 determines the length of each encoded data stream by summing the multiplication of the frequency count of each literal and string parameter to the bit length of each Huffman encoding matched to each literal and string parameter. The bit length of the optimal Huffman encoded data stream is further offset by the length of the optimal Huffman code dictionary, which is the aggregation of the length of the symbol by the sorting engine 424.

The state machine 402 determines a shorter encoded stream between the optimal Huffman coded stream and the fixed Huffman coded stream (block 908).

The state machine 402 selects the shorter of the two output encoded stream and signals the selector 410 to provide the selected dictionary to the mapping engine 404 (block 910). The mapping engine 404 receives and translates the stream of literal and strings 316 into a stream of fixed Huffman encoded symbols.

Within the Deflate protocol, data can be formatted in three different formats: an uncompressed data stream, a compressed data stream encoded with fixed Huffman code, and a compressed data stream encoded with optimal Huffman symbols.

Figure 7A:
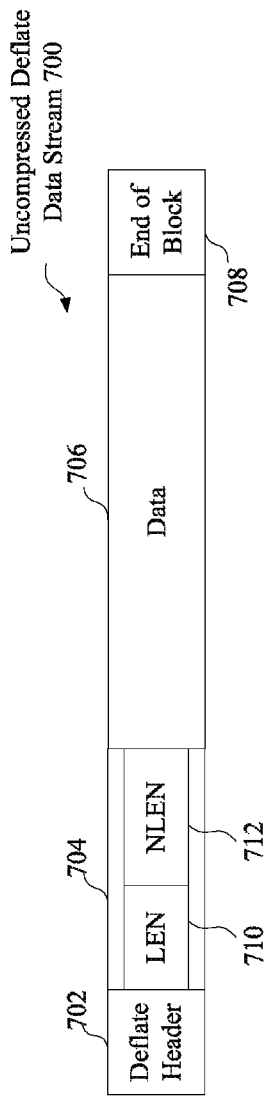
FIG. 7A is a diagram of an uncompressed data stream according to the Deflate protocol that is generated and operated upon by the compression and decompression system in accordance with the illustrative embodiment.

The system and method to produce an uncompressed data stream is now discussed referring to FIG. 7A. FIG. 7A is a diagram of an uncompressed data stream encoded according to the Deflate protocol in accordance with the illustrative embodiment is shown. The uncompressed data stream 700 comprises Deflate header information 702, length information 704, data information 706, and an end of block marker 708. The length information 704 consists of length information and redundant length information expressed in two-complimentary of the length 712. See Section 3.2.4 of the RFC 1951.

To generate an uncompressed data stream, the mapping engine 404 adds a Deflate header to the encoded output stream 318. The state machine 402 determines the length of uncompressed literal bytes to be included within the data stream. The state machine 402 determines the two-complimentary of the length value. The range of length where is 1-256. The mapping engine 404 appends the number of literal bytes and two-complement thereof to the encoded output stream 318. The mapping engine 304 then copies the stream of literals and strings as data information 706 to the output stream, and then appends an end of block 708

Figure 7B:
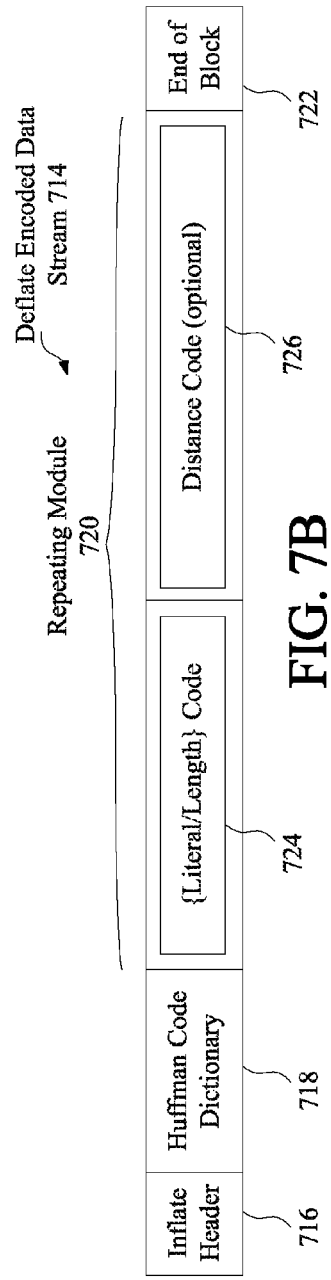
FIG. 7B is a diagram of a data stream encoded according to the Deflate protocol with optimal Huffman encoding that is generated and operated upon by the compression and decompression system in accordance with the illustrative embodiment.
Figure 7C:
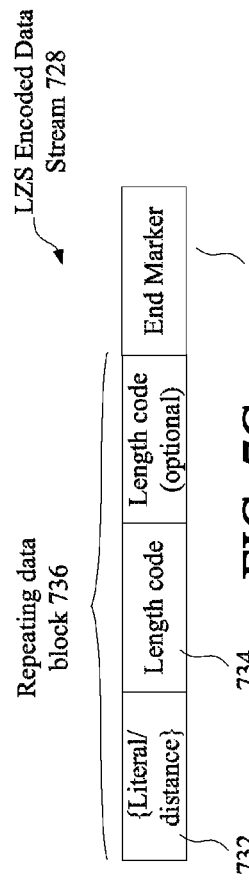
FIG. 7C is a diagram of a data stream encoded according to the LZS protocol that is which generated and operated upon by the compression and decompression system in accordance with the illustrative embodiment.

The system and method to produce a compressed Deflate data stream is now discussed referring to FIG. 7B. FIG. 7B is a diagram of a compressed Deflate data stream 714 encoded for optimal Huffman encoding or fixed Huffman encoding in accordance with the illustrative embodiment is shown.

The compressed Deflate data stream 714 comprises a Deflate header 716, a Huffman coded dictionary 718 (optimal Huffman encoding only), a repeating data block 720 and an end of block marker 722. The repeating data block 720 consists of a literal/length code 726 and an optional distance code 726. The first repeating symbol in the repeating data block 720 is a literal or a length code. If a literal is present, the repeating data block 720 can be followed with another repeating data block. If a length code is present, the length code is followed by the optional distance code 726. The length and distance codes for optimal Huffman data format are provided in the Deflate standard. See Section 3.2.2 and 3.2.7 of the RFC 1951.

Dynamic Huffman codes are expressed in terms of bit-length as the codes are arranged such that shorter codes lexicographically precede longer codes and all codes of a given bit length have lexicographically consecutive values, in the same order as the symbols they represent.

The encoder 304 determines whether fixed Huffman encoding or optimal Huffman encoding provides a better compression ratio.

The mapping engine 404 provides the Deflate header 716 which is comprises of prefix bit pattern ("01" for fixed Huffman code and "10" for optional Huffman code). Under un-encoded output, fixed Huffman encoding, or Optimal Huffman encoding, the mapping engine 404 inserts the Deflate header 702 to the data stream 700. See Section 3.2.3 of the RFC 1951.

The optimal Huffman engine 406 calculates the optimal Huffman coded dictionary. If optimal Huffman code is selected, the mapping engine 404 appends the optimal Huffman code dictionary to the encoded output stream 318. The mapping engine 404 substitutes the literal and string parameters within buffer 400 using the optimal Huffman coded dictionary 418 within code dictionary memory 408 and append the coded symbol to the data stream. Upon the end of the buffer, the mapping engine 404 appends an end of block marker 722 to the encoded data stream.

Data stream encoded according to optimal Huffman coding comprises the encoded data as well as a coded dictionary while data stream encoded according to a fixed Huffman code comprises only of the encoded data stream. FIG. 7B illustrates a Deflate data stream, which comprises a Deflate header 716, the repeating data blocks 720, the end of block marker 722, and the code dictionary (718) (optional). As a result, once the code dictionary is generated, encoding a fixed Huffman coded data stream is near identical to encoding a dynamic Huffman coded data stream.

The literal, length, and distance codes for fixed Huffman data format are provided in the Deflate standard. See Section 3.2.5 and 3.2.6 of the RFC 1951.

During encoding, the Huffman engine 406 maintains a frequency count of the literal and strings. The length of a dynamic Huffman data stream is determined based on the frequency count. The state machine 402 compares the length of the encoded fixed Huffman data stream to the combined length of the code dictionary and encoded stream for the Optimal Huffman encoding and selects the shorter of the two. If the encoded fixed Huffman data stream is shorter, the state machine 402 signals the mapping engine 404 to encoded a fixed Huffman data stream as the encoded output stream 318.

If the combined dynamic Huffman data stream and dynamic code dictionary is shorter, the Huffman engine 406 calculates the Huffman symbols and assigns the literals, length, and distance parameters to the symbols. The symbols are stored as part of the optimal Huffman code dictionary 418 within code dictionary memory 408. The mapping engine 404 then receives the literal and strings from buffer 400 and substitutes the literal and string parameter with the optimal Huffman code dictionary 418.

Decompression System and Method

Figure 5:
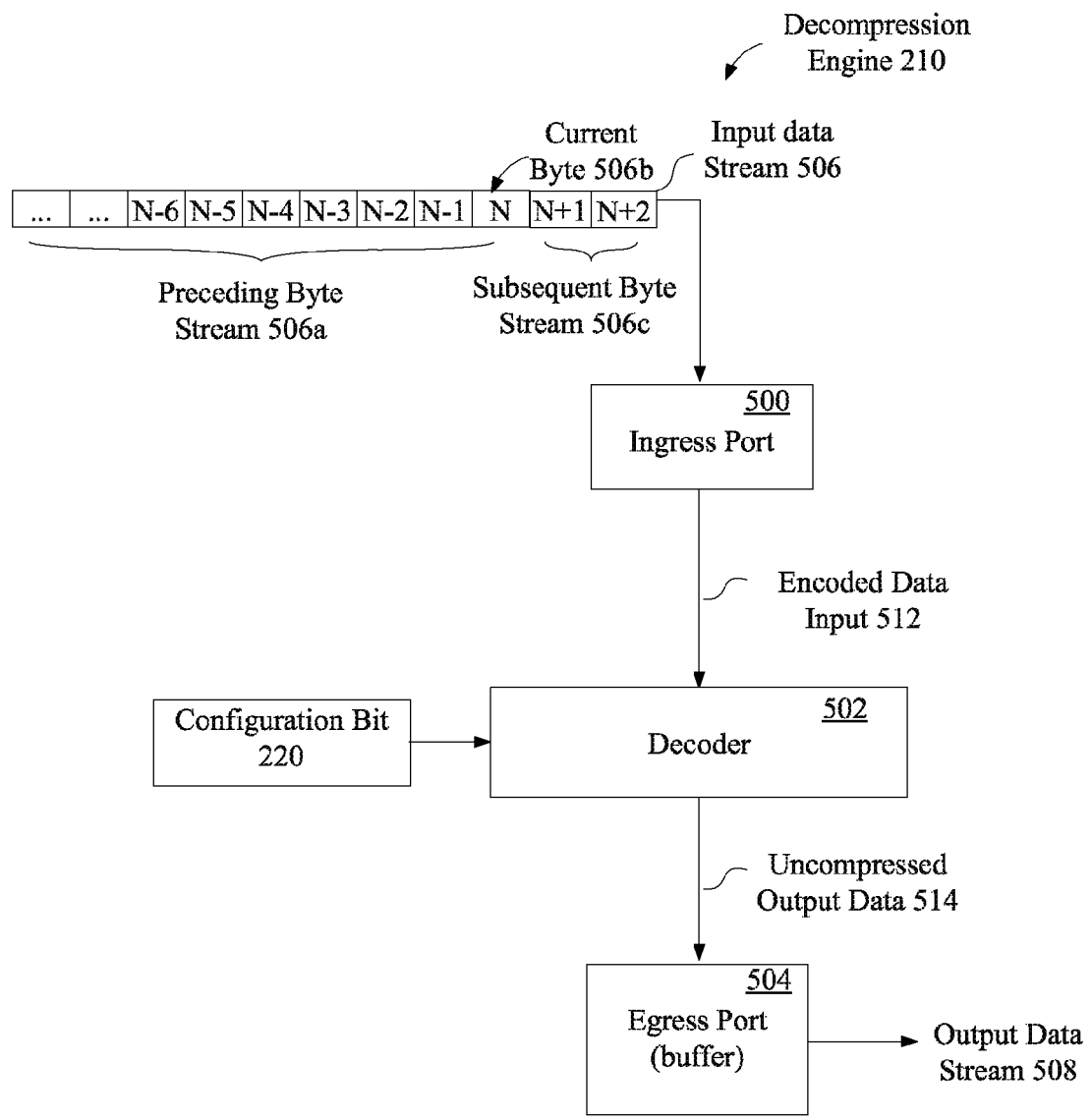
FIG. 5 is a diagram of a decompression engine in accordance with the illustrative embodiment.
Figure 10:
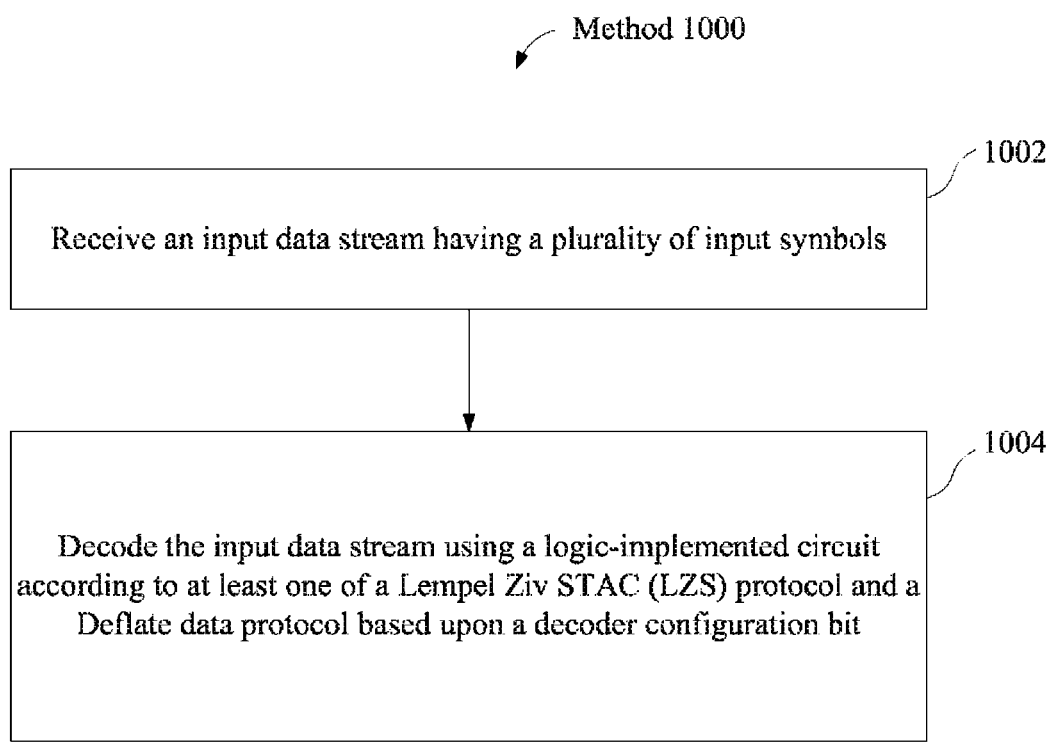
FIG. 10 is a flowchart of a decompression method in accordance with the illustrative embodiment.

A decompression system and a method thereof are now discussed with reference to FIG. 5 and FIG. 10. FIG. 5 is a diagram of the decompression engine 210 in accordance with the illustrative embodiment. FIG. 10 is a flowchart of a decompression method 1000 in accordance with the illustrative embodiment.

The decompression engine 210 comprises an ingress port 500, a decoder 502, and an egress port 504.

Upon initialization, the ingress port 500 receives the encoded data input 512 to provide a buffered input as encoded data input 512 to decoder 502 (block 1002). The decoder 502 decodes the encoded data input 512 in accordance with the Deflate protocol or the LZS protocol based upon the configuration bit 220 (block 1004). The decoder 502 provides uncompressed output data 514 to the egress port 504. The egress port buffers received uncompressed output data 514 to provide an output data stream 508. The egress port 504 aggregates the decoded literal 514 and outputs an uncompressed data stream 508.

Decoder System

Figure 6:
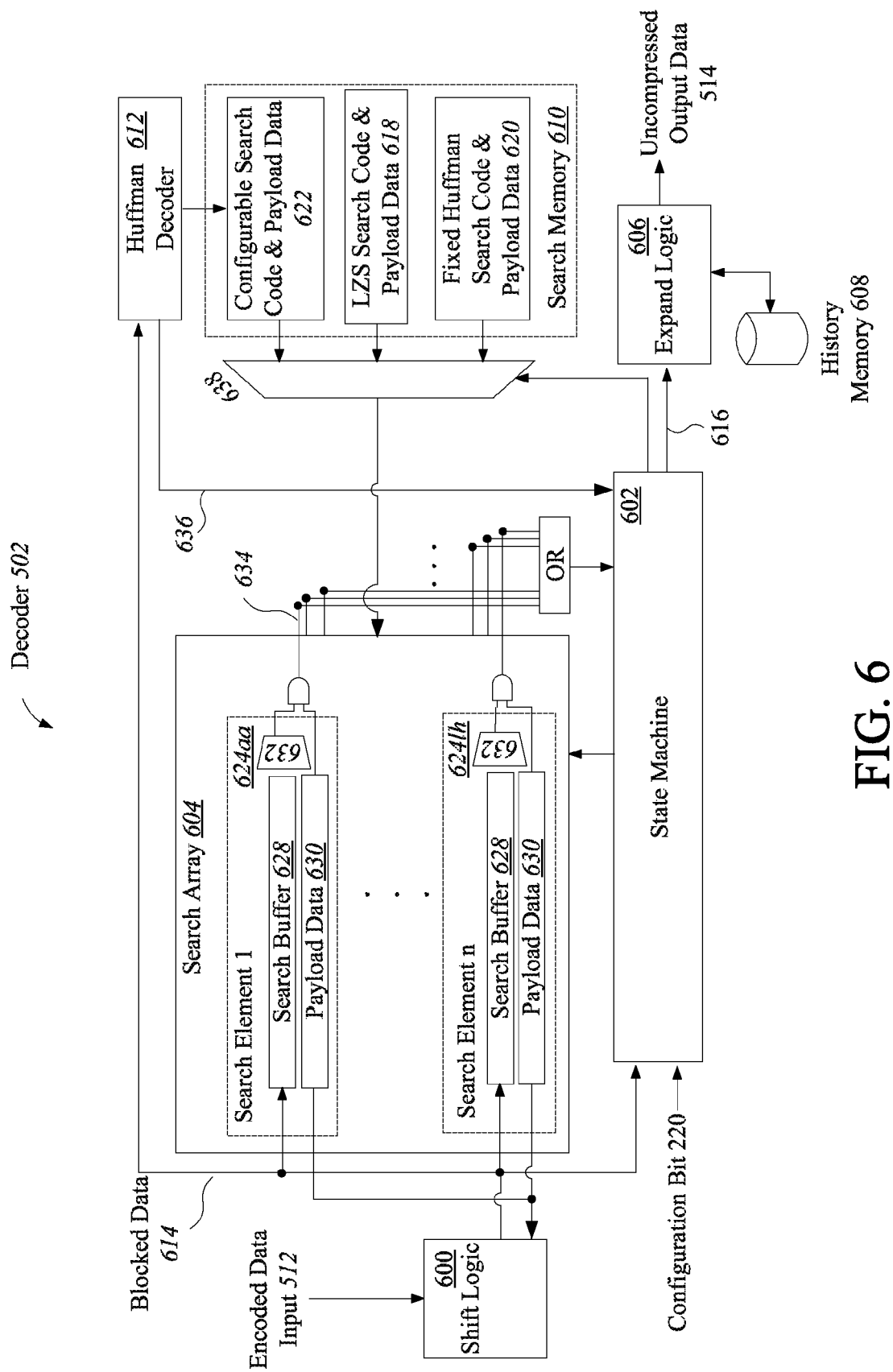
FIG. 6 is a diagram of a decoder of the decompression engine of FIG. 5 in accordance with the illustrative embodiment.
Figure 11:
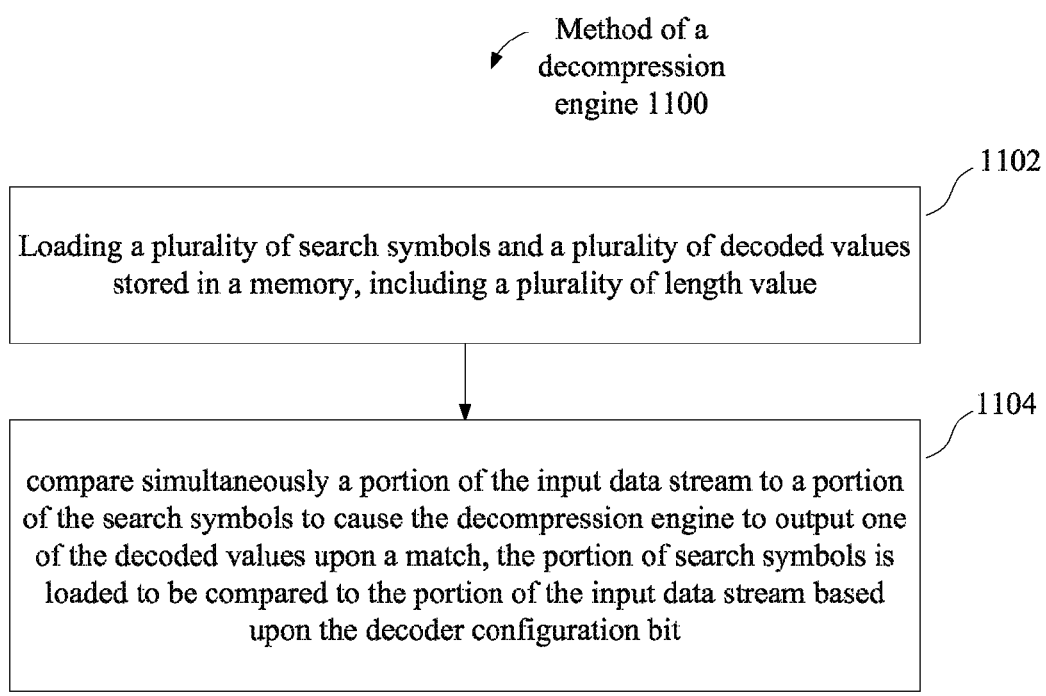
FIG. 11 is a flowchart of a decoding method in accordance with the illustrative embodiment.

A decoder and the method thereof are now discussed with reference to FIG. 6 and FIG. 11. FIG. 6 is a diagram of the decoder 502 shown in FIG. 5 in accordance with the illustrative embodiment. FIG. 11 is a flowchart of a decoding method in accordance with the illustrative embodiment.

The decoder 502 comprises a shift logic 600, a state machine 602, a search array 604, an expand logic 606, a history memory 608, a search memory 610, and a Huffman decoder 612. The decoder 502 decodes the encoded data input 512 to provide an uncompressed output data 514. The uncompressed output data 514 is formatted according to the Deflate or the LZS protocol based upon the configuration bit 220 to the state machine 602.

The shift logic 600 receives the encoded data input 512 and shifts the encoded data input 512 to expose a potential new symbol upon the decoding of a symbol in the encoded data input 512. The encoded data input 512 is provided as block data 614 to the state machine 602, the search array 604, and the Huffman decoder 612. In the illustrative embodiment, the shift logic 600 receives shift instructions from the state machine 602 and the search array 604.

The search array 604 simultaneously compares a portion of the encoded data input 512 to a set of search symbols to determine a match (block 1104). The search array 604 contains the search symbols for decoding according to the LZS and Deflate protocol. The search array 604 comprises a plurality of search elements (624aa to 624lh). Upon a match to a search element in the search array 604, the index value of the matching search element is provided to the state machine 602.

Each search element 624 comprises a search buffer 628, payload buffer 630, and comparison circuit 632.

Search buffer 628 stores the search symbols in the search array 604 based on the decoder configuration bit 220.

The payload buffer 630 holds the payload data, which is a bit count of a literal or string symbol. The shift logic 600 uses the payload data stored in the payload buffer 630 to shift the input data stream to expose the next symbol upon a match. The payload data comprises the combined length of codes and extra bits for distance and length symbols. Payload data utilized for decoding is the same when encoding.

The comparison circuit 632 compares the block data 614 to the search buffer 628. Wherein the search elements are tertiary content addressable memories (TCAMs), comparison circuits 632 are row of flip-flops. Upon matching a pattern of a symbol, the comparison circuit outputs a symbol matched signal 634 to state machine 602.

In the illustrative embodiment, upon a match, the payload data 630 is utilized as part of the symbol matched signal 634 and sent the state machine 602. The consolidation provides the information of the index number and the payload data to the state machine 602 in a serial form, allowing for a smaller data bus between the search array 604 and the state machine 602. An AND operator operates on the payload data 630 and the output of the comparison circuit 632. The output of the AND operator is sent along a data bus as symbol matched signal 634 to multiplexer 626 that aggregates the output signals of each search elements 624aa-624lh. The operator may be incorporated in to the state machine 602.

At each search cycle, the search array 604 simultaneously compares the block data 614 from the shift logic 600. A search cycle is a time period to decode a literal parameter, a distance parameter, or a portion of a length parameter. In Deflate, the operation to decode a distance code is the same as to decode a length code. However, in LZS, the length parameter can be infinite; the length codes includes a unique length code indicating a longer length (binary code "1111"). The length code results in another length code being decoded until the repeating code end. Length codes in LZS are 2 or 4 bits correlating to a length value of 2 to 7. In the illustrative embodiment, up to 8 bits (up to 2 length codes, including the unique repeating pattern and the combinations thereof) are performed in a search cycle. Upon a match, the payload data 630 of the matching search element 624 is provided to the shift logic 600. In the illustrative embodiment, the search element 624 presents the payload data directly to the shift logic 600. In alternate embodiments, the state machine presents the payload data to the shift logic 600. The payload data is sent to the state machine 602 or is accessed in the state machine 602 based upon the matching index number.

Determining simultaneously and comparing simultaneously relates to occurring within a predetermined time cycle among a series of predetermined time cycle, wherein the predetermined time cycle are identical such that variations among the predetermined time cycle are statistically insignificant to the operation of the decoder. Simultaneously further relates to an operation that is initiated and executed synchronously among multiple elements through a shared signal, e.g., a clock signal or a triggering signal.

Matching cycle and decoding cycle relate to the comparison cycle of comparison circuits 632.

The state machine 602 utilizes the symbol matched signal 634 to determine the output decoded value 616. When a length symbol or a distance symbol within the Deflate encoded data stream, or a distance symbol within the LZS encoded data stream is determined, the state machine 602 decodes extra bits within the block data 614. Extra bits are parts of the definition of a length symbol and a distance symbol within the Deflate encoded data stream, and a distance symbol within the LZS encoded data stream. However, extra bits are not considered part of the search code as searched by the search elements. The output of the state machine 602 comprises literals and string parameters as the output decoded value 616. The state machine 602 provides the output decoded value 616 to the expand logic 606.

Due to the unique aspect of the LZS length codes in having repeating patterns that can form an infinite string, the state machine may process the length codes more efficiently once a length code is expected. In the illustrative embodiment, once the state machine 602 determines a distance code, the state machine 602 signals the search array to perform one more search (as a length code is expected). The state machine 602 then continues to process the length codes until the repeating code ("1111") ends. During this operation, the state machine 602 provides the shifting signals to the shift logic 600. At the end of the length code, the state machine 602 outputs the decoded distance and length values to the expand logic 606.

In an alternate embodiment, a dedicated circuitry for decoding the LZS length code may be utilized to perform the decoding. In another alternate embodiment, decoding of the LZS length codes may be performed using the search array 604 loaded with the LZS length codes. In the embodiment, the state machine or the dedicated circuitry determines the decoded length value based on the matching search elements.

The expand logic 606 receives the literal and strings parameters within the output decoded value 616 from the state machine 602. The expand logic operates with a history memory 608 to maintain a history window of the uncompressed output data 514. The history memory 608 stores the previous history of the output of the expand logic 606. The expand logic 606 expands the string parameters to a stream of literals and provides the literals and expanded literals as the uncompressed output data 514. When a literal parameter is received, the expand logic 606 copies literal values received from the state machine 602 to the uncompressed output data 514. When a string parameter (length and distance parameters) is received, the expand logic 606 shifts the history memory by the distance parameter to an offset position. The expand logic 606 copies a byte stream of the length parameter from the offset position. The history memory 608 stores the output stream as the stream is outputted from the decoder 502.

The search memory 610 comprises a LZS search code and payload data 618, a fixed Huffman search code and payload data 620, and an optimal Huffman search code and payload data 622. The search memory 610 receives and stores the optimal Huffman search code and payload data 622 generated from the Huffman decoder 612. During initialization, the search memory 610 provides the search codes 618, 620, 622 to the selector 638. The selector 638 directs the selected search codes to be loaded to the search array 604 based on the signal from the state machine 602 (block 1102).

The Huffman decoder 612 translates the optimal Huffman coded dictionary within the encoded data stream. Section 3.2.2 and 3.2.7 of RFC 1951 provides an example to perform decoding of the optimal Huffman code dictionary. In the illustrative embodiment, conventional Huffman decoders are utilized.

Decoder Method a. Uncompressed Deflate Data Stream

Figure 12:
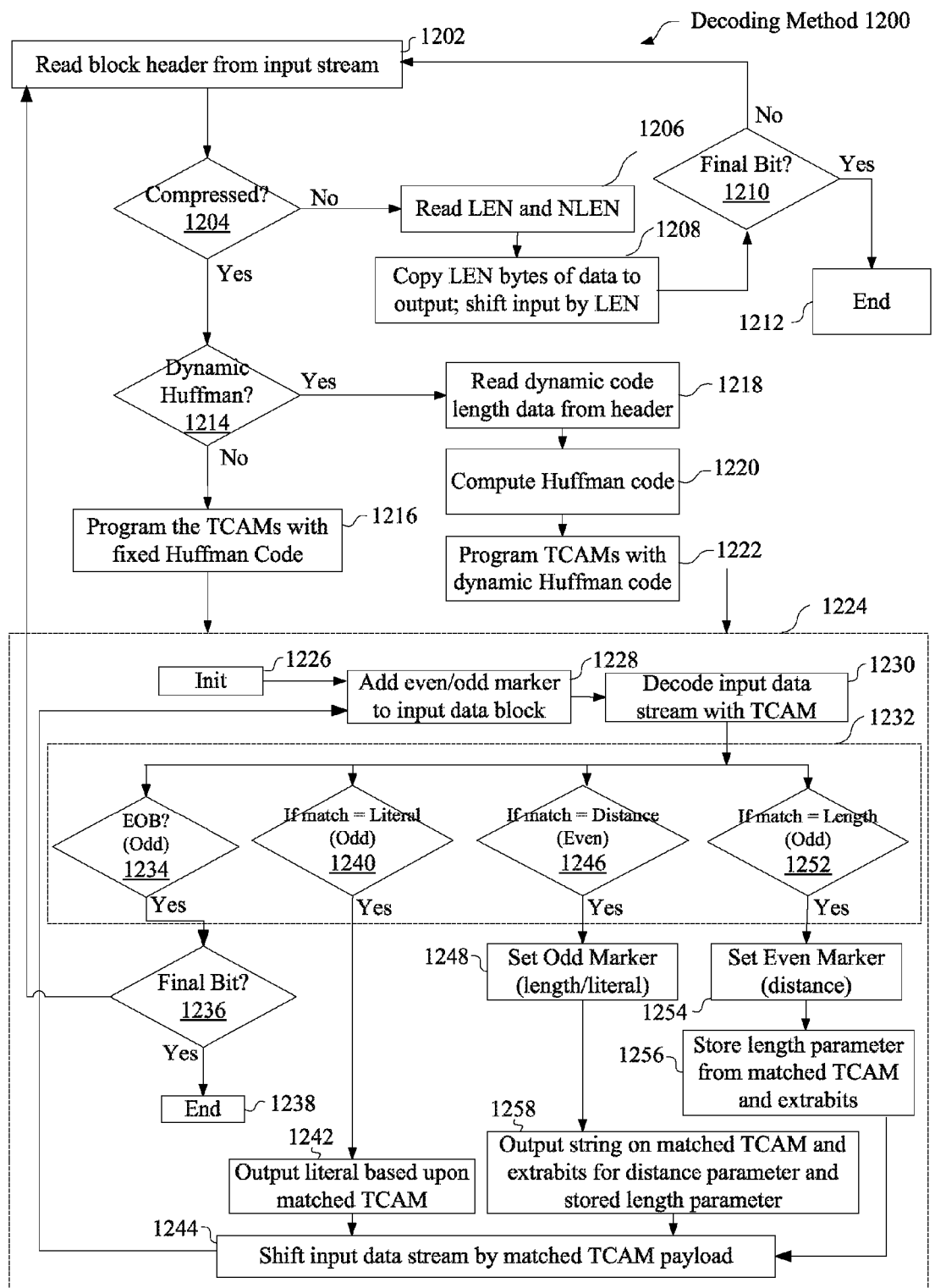
FIG. 12 is a flow chart of a decompression method according to the Deflate protocol in accordance with the illustrative embodiment.

The operation of the decoder 502 is now discussed. The operation of the decoder 502 performing Deflate decoding is first discussed (FIG. 12). The decompression method 1200 begins; the state machine 602 reads block header information from the input data stream 506 (block 1202). The state machine 602 determines if the block header indicates that the input data stream 506 is compressed (step 1204). In the scenario where the data stream is not compressed, a parameter of the length of uncompressed bytes and two's compliment of the parameter is read (block 1206). The uncompressed bytes of the length parameter are copied to the output (block 1208). The shift logic 600 shifts the input data stream by the combined bit length of the length parameter, the two complement of the length parameter, and the uncompressed byte length to expose the next encoded data stream. In the event that the final byte marker was received (block 1210), the state machine ends the decoding process (block 1212). In the event that it is not, the state machine 602 reads a block header from input data stream 506 (block 1202).

In the scenario where a compressed data stream is present, the state machine 602 receives from the configuration bit 220 (block 1214). If Dynamic Huffman codes were used, the Huffman decoder 612 reads the code dictionary from the data stream (block 1216) and computes the Huffman code (block 1218). The resulting decoded Huffman codes are loaded into the search memory 610 and loaded into the search elements 624 (block 1220).

b. Fixed Huffman Deflate Data Stream

When fixed Huffman codes are utilized (block 1212), fixed Huffman encoded symbols and payload data 620 are loaded into the search elements 624 (block 1222). Block 1224 illustrates the decoding operation for a Deflate compressed data stream and is identical for decoding Deflate fixed or dynamic Huffman codes.

Upon the loading of the search codes into the search elements, the decoding process is initialized (block 1226). At step 1228, a distinguishing marker is appended to the block data 614. The distinguishing marker is initialized to an odd value. If a length code is last matched, the distinguishing marker is set to append an even marker, so the distance code will match in the next search.

The search array 604 decode input data stream by simultaneously comparing the search codes in the search elements of the TCAM with the block data 614 with the appended distinguishing marker (block 1230). The resulting match of the search array 604 determines the action of the state machine 602 (block 1232). There are at least five scenarios that may arise. The first scenario (not shown) is where a non-match event occurs. As a result, the decoder generates an error output to the user.

In a second scenario, an end of byte code is matched (block 1234). The state machine 602 looks at the next bit to determine if a final bit code is present (block 1236). If a final bit is present, the decoding ends (block 1238). If a non-final bit code is present, the decoder reads a block header from the input stream (block 1202).

In a third scenario, a literal code is matched (block 1240). The state machine 602 receives the index value of the matched search element and outputs a literal value as the output decoded value 616 (blocker 1242). The shift logic 600 receives the payload data 630 from the matched search element and shifts the encoded data input 512 to expose the next code symbol (block 1244). The decoding process repeats back to block 1228.

In a fourth scenario, a length code is matched (block 1252). The state machine 602 sets the marker to even (block 1254). The state machine 602 receives the index value of the matched search element, which signals the state machine 602 to examine a predetermined number of extra bits. The state machine 602 uses the index value number and the extra number of bits to determine the decoded length value. The decoded length values are stored within the state machine 602 (block 1256). The shift logic 600 receives the payload data from the search array 604 (block 1244), the payload data indicating the number of bits within the symbol and the extra bits corresponding to the symbol. The process 1224 repeats back to block 1228.

In a fifth scenario, a distance code is matched (block 1246). The state machine 602 sets the next marker to odd (block 1248). The state machine 602 receives the index value of the matched search element, which signals the state machine 602 to examine a predetermined number of extra bits. The state machine 602 uses the index value of the matching search element and the predetermined extra number of bits to determine the decoded distance value. The state machine 602 retrieves the stored length value and outputs length and distance values as the output encoded values 616. The shift logic 600 receives payload data comprising the combined length of the distance code and known extra bits and shifts the input data stream 506 by the payload data (block 1244). The process 1224 repeats back to block 1228.

Compressed Deflate Search Codes

Figure 14A:
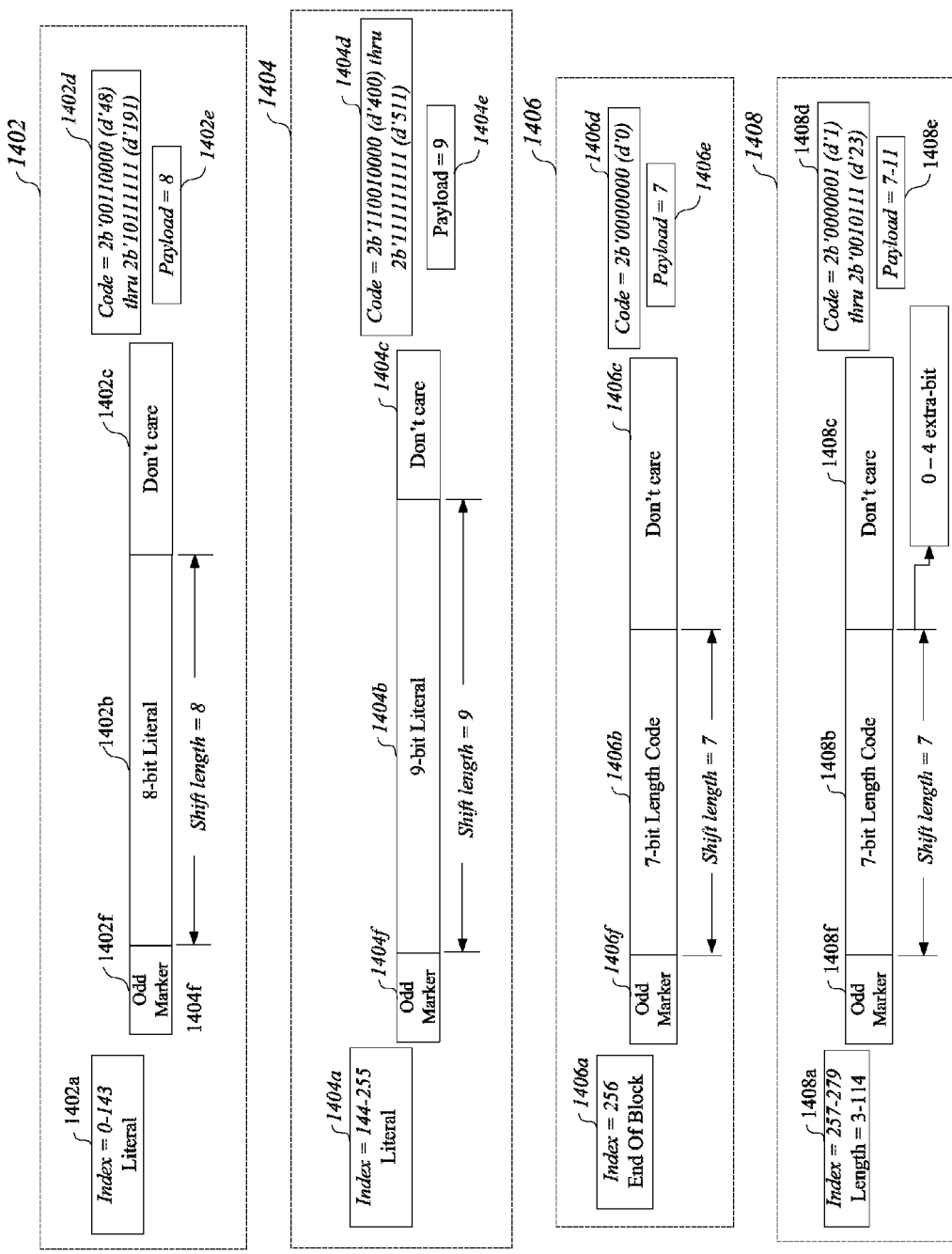
FIG. 14A is a diagram of a portion of the fixed Huffman search codes loaded into the search array when decoding according to the Deflate protocol in accordance with the illustrative embodiment.
Figure 14B:
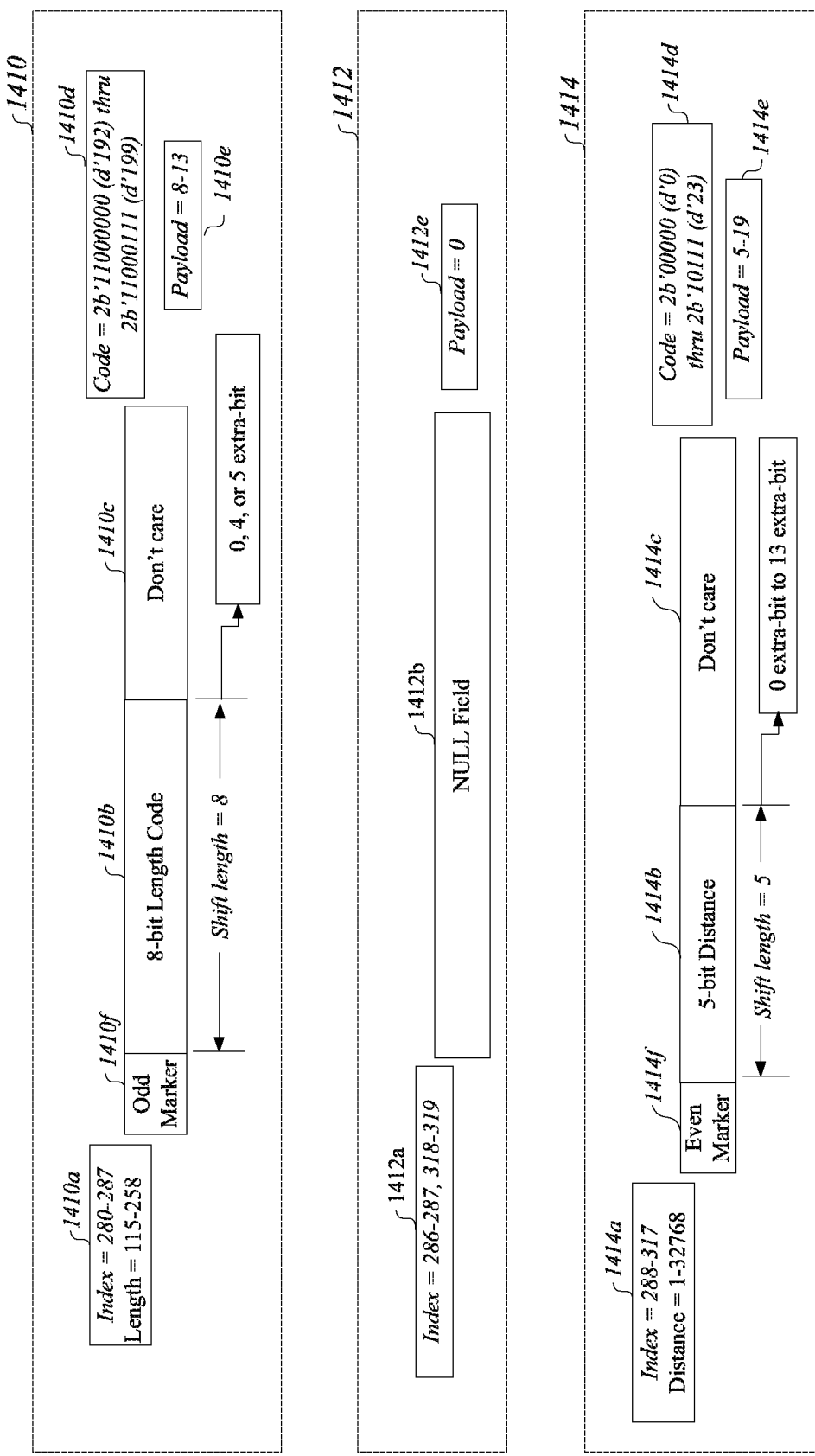
FIG. 14B is a diagram of another portion of the fixed Huffman search codes loaded into the search array when decoding according to the Deflate protocol in accordance with the illustrative embodiment.

FIG. 14A, FIG. 14B, and FIG. 14C are the search codes and payload data 620 for fixed Huffman decoding. Search codes 620 comprise 7 categories of patterns, including: literal codes 1402, literal codes 1404, end of block code 1406, length codes 1408, length codes 1410, null code 1412, and distance codes 1414.

The dynamic Huffman search codes and payload data 622 comprise patterns similar to the fixed Huffman search codes 620. The literals, length, and distance codes are assigned bit-patterns of varying bit length according to their frequency in the buffer 400. However, extra bits codes for distance and length values remain identical to the extra bits patterns defined for the fixed Huffman codes as defined in Section 3.2.5 and 3.2.6 of the Deflate standard.

A distinguishing marker (1402f, 1404f, 1406f, 1408f, 1410f, 1412f, 1414f) is appended to each search code allowing distance, length, and literal codes to be co-located in the same search array. In the illustrative embodiment, the distinguishing markers are a single bit pattern ("0" and "1") denoted as "odd" or "even". Distinguishing markers may have other bit pattern, which are longer than 1 bit. Distinguish markers may be implemented as signals provided to search elements 624 to distinguish length and distance codes between the decoding cycle. Distinguishing markers are considered a part of the search codes during matching, but are not considered a part of the search codes in the determination of the payload data. Odd markers 1402f, 1404f, 1406f, 1408f, 1410f are appended to the first bit of the literal codes 1402, 1404, end marker code 1406, and length codes 1408, 1410. Even markers 1414f are appended to the first bit of the distance codes 1414.

Literal codes 1402 comprise 144 codes representing literal values 0 to 143 (1402a). The literal codes are 8-bit data pattern (1402b). Bits 9-15 within the search element are set as "Don't Cares". The 144 8-bit patterns have a binary value "0011 0000" (decimal value=48) to "1011 1111" (decimal value=191) (1402*d*). The payload for search code 1402 is 8 (1402*e*).

Literal codes 1404 comprise 112 elements representing literal values 144 to 255 (1404*a*). The literal codes are 9-bit data pattern (1404*b*). Bits 10-15 within the search elements are set as "Don't Cares". The 112 9-bit patterns have a binary value "1 1001 0000" (decimal value=400) to "1 1111 1111" (decimal value=511) (1404*d*). The payload for search code 1404 is 9 (1404*e*).

End of block code 1406 comprises a 7-bit pattern representing the end of the Deflate data stream. Bits 8-15 within the search elements are set as "Don't Cares". The 7-bit pattern has a binary value "000 0000" (decimal value=0) (1408*d*). The payload for search code 1402 is 7 (1406*e*).

Length codes 1408 comprise 23 codes (index 257-279) representing length values 3 to 114 with the inclusions of 0-4 extra bits (1408*a*). The length values are 7-bit data pattern with 0 to 4 extra bits (1408*b*). Bits 8-15 within the search elements are set as "Don't Cares" within the search elements. The state machine 602 processes the extra bits along with the matching code. The code that is found matching indicates to the state machine 602 of the number of extra bits to process. The 7-bit patterns have a binary value "000 0001" (decimal value=1) to "001 0111" (decimal value=23) (1408*d*). The payload for search code 1404 varies from 7 to 11 (1408*e*); tables 1408*k*, 1408*l*, 1408*m* show the payload data for each of the 23 codes. Each table 1408*k*, 1408*l*, 1408*m* shows the code pattern 1408*g*, the number of extra-bits 1408*h*, the matched length parameter 1408*i*, and the payload data 1408*j*.

Length codes 1410 comprise 6 codes (index 280-285) representing length values 115 to 258 with the inclusions of 0-5 extra bits (1410*a*). The length codes are an 8-bit data pattern with 0 to 5 extra bits (1410*b*). Bits 9-15 within the search elements are set as Don't Cares within the search element, the extra bits are processed by the state machine 602 along with the matching symbol. The symbol that is found matching indicates to the state machine 602 of the number of extra bits to process. The 8-bit patterns have a binary value "1100 0000" (decimal value=192) to "1100 0111" (decimal value=199) (1410*d*). The payload for search code 1410 varies from 8 to 13 (1410*e*); tables 1410*k*, 1410*l*, 1410*m* show the payload data for each of the 6 elements. Each table 1410*k*, 1410*l*, 1410*m* shows the code pattern 1410*g*, the number of extra-bits 1410*h*, the matched length parameter 1410*i*, and the payload data 1410*j*.

Null code 1412 represents unused search fields. In the illustrative embodiment, the unused fields include index values 286, 287, 318, 319. The payload for a not used field is "0". The unused fields are loaded with a known error pattern to provide an error monitoring mechanism to the state machine 602 in case a fault code is detected. In alternate embodiments, the unused fields loaded with at least one Disabled/Don't Match field.

Distance codes 1414 comprise 30 codes (index 288-317) representing distance values 1 to 32,768 with the inclusions of 0-13 extra bits (1414*a*). The distance values are 5-bit data patterns with 0 to 13 extra bits (1414*b*). Bits 6-15 within the search elements are set as "Don't Cares" within the search elements, the extra bits are processed by the state machine 602 along with the matching symbol. The symbol that is found matching indicates to the state machine 602 of the number of extra bits to process. The 5-bit patterns have a binary value "0 0000" (decimal value=0) to "1 1101" (decimal value=29) (1414*d*). The payload for search code 1414 varies from 0 to 13 (1414*e*); tables 1414*k*, 1414*l*, 1414*m* show the payload data for each of the 30 elements. Each table 1414*k*, 1414*l*, 1414*m* shows the code pattern 1414*g*, the number of extra-bits 1414*h*, the matched length parameter 1414*i*, and the payload data 1414*j*.

The extra bits for the length codes 1408, 1410 and distance codes 1414 are interpreted as machine integers stored with the most-significant bit first.

It should be appreciated that the patterns presented are mere example and other classification schemes may be utilized, for example, classifying the bit patterns in two categories: a fixed length pattern, and a fixed length pattern with extra bits.

Limpel Ziv Stac (LZS) Decoding

Figure 13A:
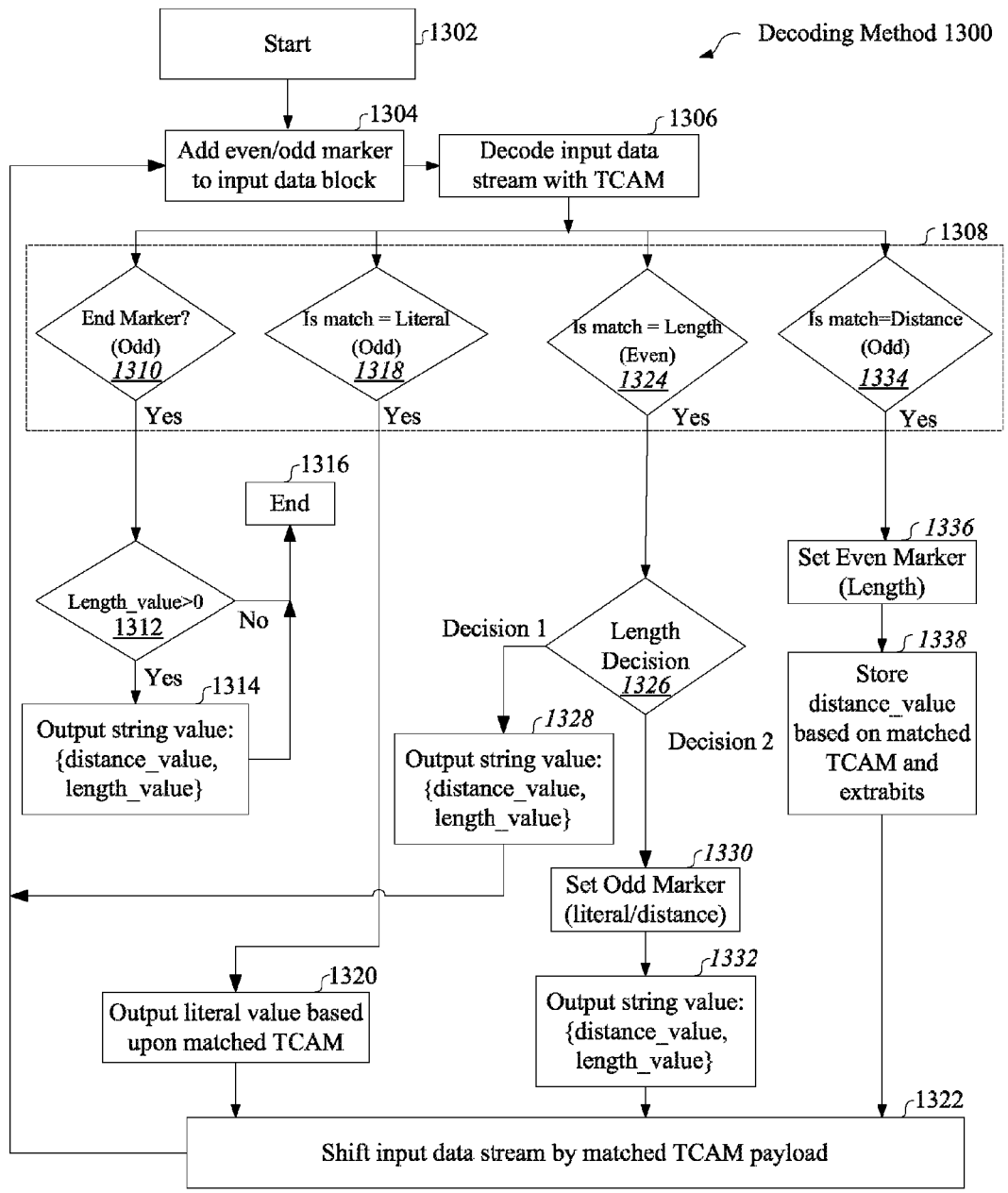
FIG. 13A is a flow chart illustrating the decompression method according to LZS protocol in accordance with the illustrative embodiment.
Figure 13B:
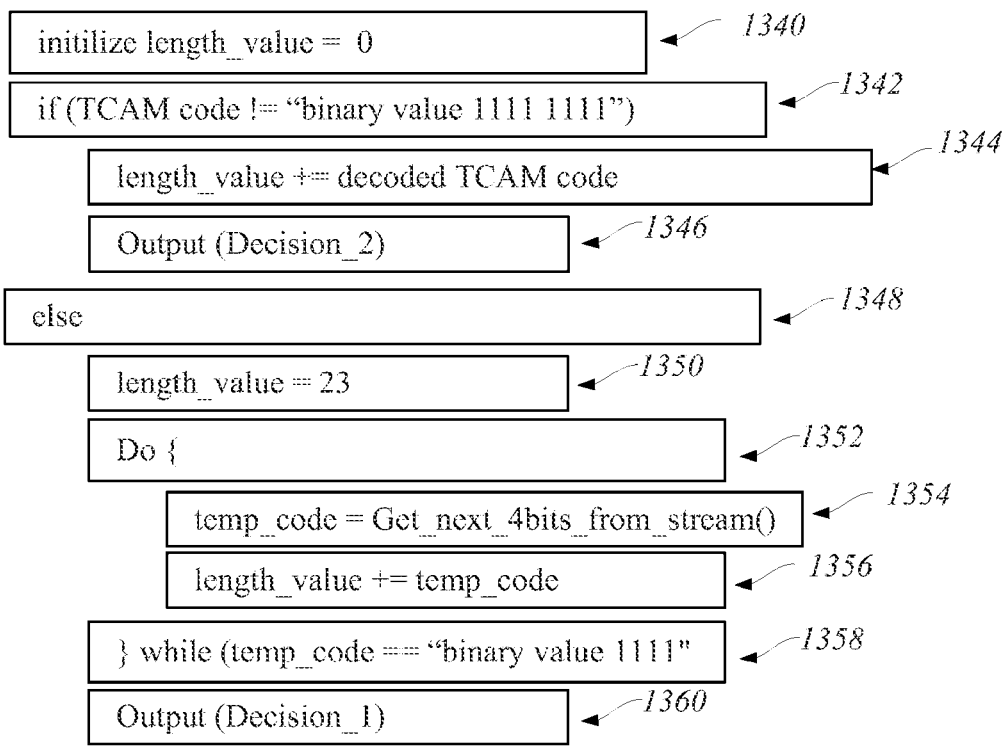
FIG. 13B is a diagram of pseudo-code of a method in the decompression method of FIG. 13A in accordance with the illustrative embodiment.

The operation of the decoder 502 for LZS decoding is now discussed with reference to FIG. 13A and FIG. 13B. FIG. 13A is a flow chart illustrating the decompression method according to LZS protocol in accordance with the illustrative embodiment. FIG. 13B is a diagram of pseudo-code of the method of FIG. 13A in accordance with the illustrative embodiment.

The decoding method 1300 begins at block 1302 At block 1302, the LZS search codes and payload data 618 is loaded into the search buffer 628 and payload buffer 630.

At step 1304, a distinguishing marker is appended to the blocked data 614. The distinguishing marker is initialized to an odd value. If a distance string parameter is last matched, the distinguishing marker is set to append an even marker, resulting in a length parameter matching in the next search.

The search array 604 decodes input data stream by simultaneously comparing the search codes in the search elements with the blocked data 614 appended with distinguishing markers (block 1306). The resulting match of the search array 604 determines the action of the state machine 602 (block 1308). There are at least five scenarios that may arise. The first scenario (not shown) is where a non-match event occurs. As a result, the decoder generates an error output to the user.

In a second scenario, an end marker code is matched (block 1310). If a length_value is in queue (block 1312), the state machine 602 outputs a string value comprising of the length and distance values (block 1314). If there is no length_value in queue (block 1312), the state machine 602 ends the decoding process (block 1316).

In a third scenario, a literal code is matched (block 1318). The state machine 602 receives the index value of the matching search element and outputs a literal value as the output decoded value 616 based upon the received indexed value (block 1320). The shift logic 600 receives the payload data from the matching search element and shifts the encoded data input 512 to expose the next symbol (block 1322). The decoding process 1300 repeats back to block 1304.

In a fourth scenario, a distance code is matched (block 1334). The state machine 602 sets the marker to even (block 1336). The state machine 602 receives the index value of the matching search element and the extra number of bits to determine a decoded distance value. The decoded distance value is stored within the state machine 602 (block 1338). The shift logic 600 receives the payload data from the search array 604 (block 1322) comprising the combined length of the code and extra bits. The decoding process 1300 repeats back to block 1304. In an alternate embodiment, the state machine 602 signals the search array 604 to perform one more searching for a length code.

In a fifth scenario, a length code is matched (block 1324). The state machine 602 evaluates the matched length code in Length Decision block 1326. The Length Decision Block 1326 is illustrated in FIG. 13B. The state machine 602 selects Decision_1 if a length repeating code (binary value="1111

1111") is matched by the search element. The state machine 602 selects Decision_2 if a non-length repeating code is matched.

Upon selecting Decision_1, the state machine 602 has determined the total length value in block 1326. As a result, the state machine 602 retrieves and outputs the stored distance values and length values as the output decoded value 616 (block 1328). The process repeats back to block 1304.

Upon selecting Decision_2, the state machine 602 sets the marker to odd (block 1330). The state machine 602 retrieves and outputs the stored distance values and length values as the output decoded value 616 (block 1332). The shift logic 600 receives the payload data comprising the combined bit length of the code and the extra bits and shifts the input data stream using the payload data (block 1322). The process repeats back to block 1304.

The length decision 1326 is now discussed with reference to FIG. 13B.

Definitions of variable, expressions, and operators are discussed.

An "if(condition)" statement is a conditional expression such that a satisfied condition results in the content of the "if" statement being executed.

An "else" statement is a conditional expression utilized in conjunction with the "if" statement such that a non-satisfied condition in the "if" statement results in the content of the "else" statement being executed.

A "Do {code statements} while(condition)" statement is a conditional expression such that code statements within Do expression is executed at least once and would continue to be executed so long as the condition is true.

A "parameter 1+=parameter 2" operator indicates that the value of parameter 1 is incremented by a value of parameter 2.

The variable "length_value" is a counter that maintains the value of the decoded length value.

The variable "decoded TCAM code" is the decoded length value associated with the TCAM code.

At length decision 1326, the state machine 602 begins at code statements 1340. At code statement 1340, the variable length_value is initialized to a value of "0".

In the illustrative embodiment wherein the search elements are TCAMs, at code statement 1342, the state machine 602 evaluates an "if" condition to determine if the matched TCAM code is not a length repeating symbol (e.g., binary value "1111 1111"). If the condition 1342 is satisfied, the state machine 602 operates code statements 1344 and 1346. At code statement 1344, the variable length_value is incremented by a value of the decoded TCAM code.

The state machine 602 then selects "Decision 2" as the output.

When the "if" condition 1342 is not satisfied, the state machine 602 evaluates the else statement 1348. The state machine 602 executes code statements 1350 and 1352. At code statement 1350, the variable length_value is incremented by a value of "23", which is the decoded length value of code "binary 1111 1111". At code statement 1352, the state machine 602 evaluates code statements 1354 and 1356 and determines whether to repeat code statement 1354, 1356, 1358 if condition 1358 is satisfied.

At statement 1354, the state machine 602 evaluates 4 subsequent bits from the blocked data 614 and signals the shift logic 600 to shift the encoded data input 512 by 4 bits within function "Get_next_4bits_from_stream( )" (1354). The state machine 602 decodes the 4 bit code from the stream with the length values as shown in Table 1512d and 1512e in FIG. 15C and stores the value as a temporary variable ("temp_code"). At code statement 1356, the length_value is incremented by a value of the variable temp_code. At code statement 1358, the state machine 602 evaluates if the variable temp_code has the value "binary 1111". A satisfied condition results in the state machine 602 operating on code statement 1354, 1356 and 1358 again.

When condition 1358 is not satisfied, the state machine 602 ends the length decision 1326 (code statement 1360) and "Decision 1" is selected.

Processes 1300 and 1224 illustrate functional similarities between LZS and Deflate decoding that is enabled by using reconfigured circuitries between the two. Loading of the symbols may be performed by the same circuitries. Once the search array is loaded with the search codes and payload data, the search array may perform the search operation with the same circuitries. The shift logic 600 also may use the same circuitries between LZS and Deflate decoding.

Figure 15A:
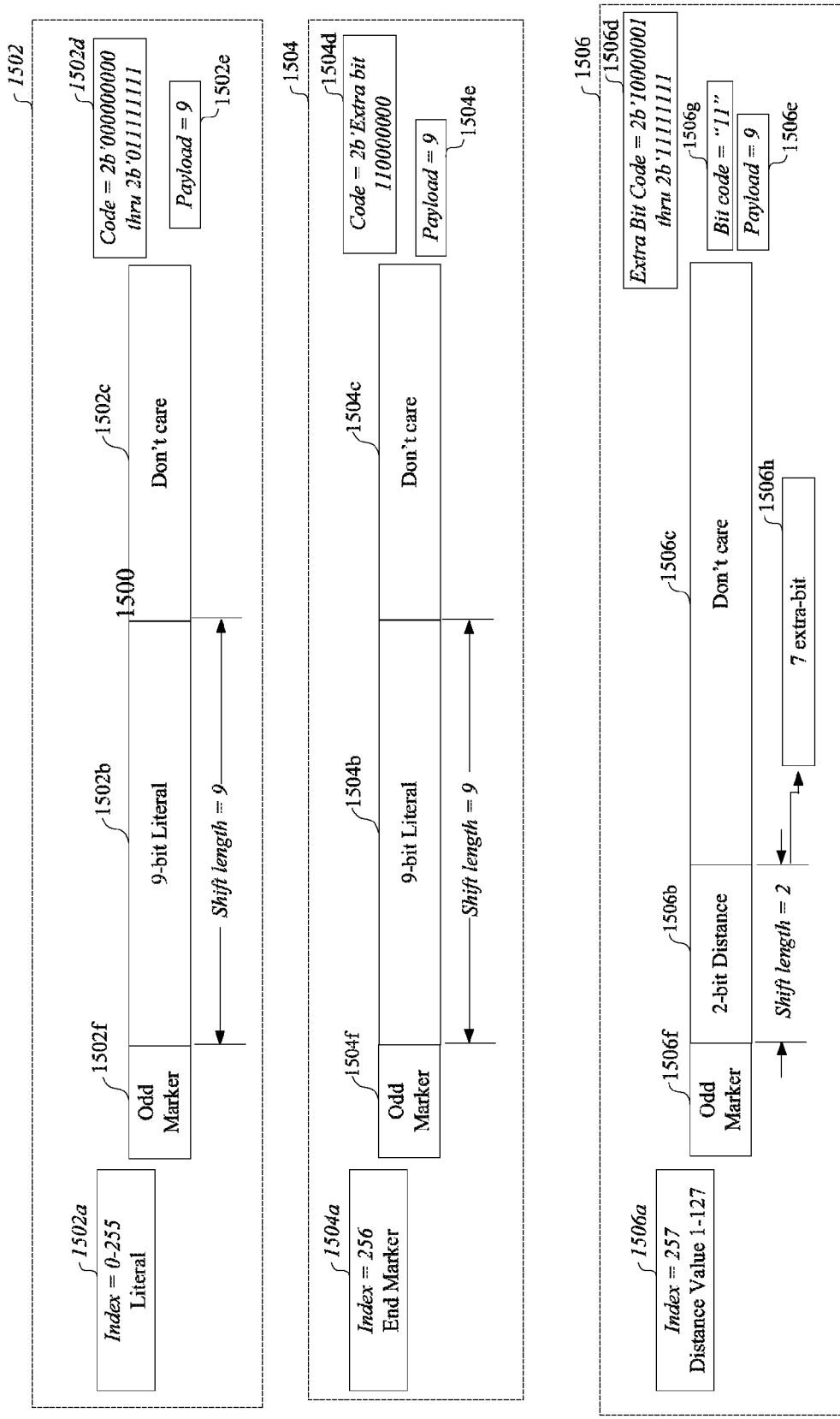
FIG. 15A is a diagram of a portion of the LZS search codes loaded into the search array when decoding according to the LZS protocol in accordance with the illustrative embodiment.
Figure 15B:
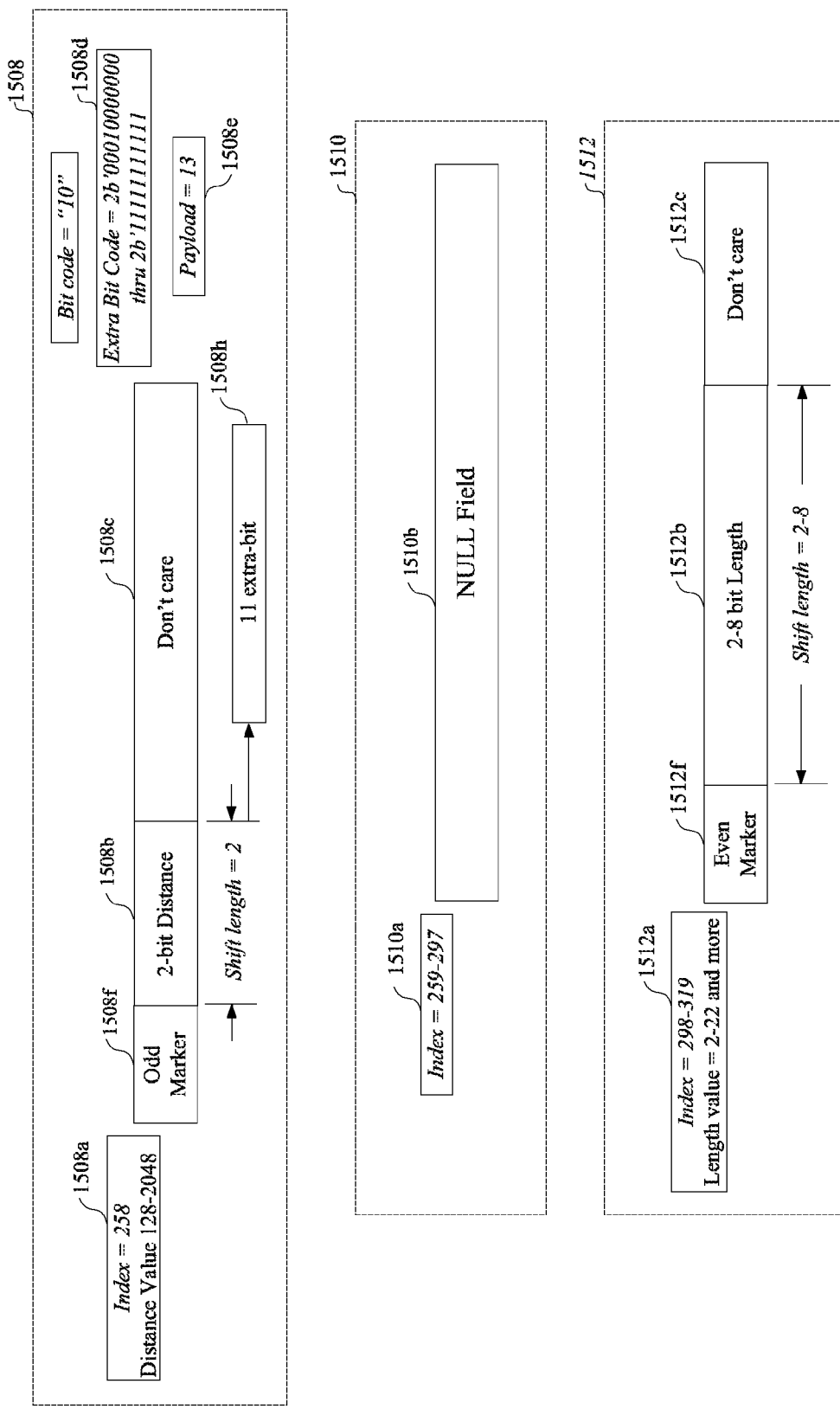
FIG. 15B is a diagram of another portion of the LZS search codes loaded into the search array when decoding according to the LZS protocol in accordance with the illustrative embodiment.

FIG. 15A, FIG. 15B, and FIG. 15C illustrates the search codes and payload data 618 for LZS decoding. FIG. 15A is a diagram of a portion of the LZS search codes loaded into the search array when decoding according to the LZS protocol in accordance with the illustrative embodiment. FIG. 15B is a diagram of another portion of the LZS search codes loaded into the search array when decoding according to the LZS protocol in accordance with the illustrative embodiment. FIG. 15C is a diagram of yet another portion of the LZS search codes loaded into the search array when decoding according to the LZS protocol in accordance with the illustrative embodiment.

Search codes 618 comprise 6 categories of patterns shown as search code, including: literal code 1502, end marker code 1504, distance code 1506, distance code 1508, null code 1510, and length code 1512.

Literal search codes 1502 comprise 256 codes representing literal values "0" to "255" (1502). The literal values are 9-bits data patterns (1502b). Bits 10-15 within the search elements are set as "Don't Cares". The 256 9-bit literal patterns have a binary value "0 0000 0000" (decimal value=0) to "0 1111 1111" (decimal value=255) (1502d). The payload for search codes 1502 is 9 (1502e).

End marker code 1504 comprise a 9-bit code representing the end of the LZS data stream. Bits 10-15 within the search elements are set as "Don't Cares". The end marker code has a binary value of "1 1000 0000" (decimal value=384). The payload for search codes 1504 is 9 (1502e).

Distance search code 1506 (index 257) comprises a single 2-bit code pattern (1506b) representing distance values 1-127. Bits 3-15 within the search elements are set as "Don't Cares" and 7 extra bits are processed by the state machine 602 along with the matching symbol. The 2-bit pattern has a binary value of "11" (1506d). The payload for search code 1506 is 9 (1506e).

Distance search code 1508 (index 258) comprises a single 2-bit code pattern (1508b) representing distance values 128-2048. Bits 3-15 within the search elements are set as "Don't Cares" and 11-extra bits are processed by the state machine 602 along with the 2-bit pattern. The 2-bit pattern has a binary value "10" (1508d). The payload for search code 1506 is 13 (1506e).

The extra bits for distance codes 1506, 1508 are processed by the state machine 602 along with the matching symbol. The symbol found matching indicates to the state machine 602 of the number of extra bits to process. The 7 extra bits for distance codes 1506 have a binary value of "000 0001" (decimal value=1) to "111 1111" (decimal value=127). The 11 extra bits for distance codes 1508 have a binary value of "000 1000 0000" (decimal value=128) to "1 111 1111 1111" (decimal value=2047).

Null search codes 1510 represent unused search field. In the illustrative embodiment, the unused fields include index value 259-297. The payload data for unused fields is "0". The unused fields are pre-loaded with a known field value that is known to not exist to provide an error monitoring mechanism to the state machine 602 in case a fault code is detected. In alternate embodiments, the null search codes are loaded with at least one "Disabled/Don't Match" state.

Length search codes 1512 comprise 22 elements (index 298-319) representing length values 2-22 and repeating code (1512*a*). The length codes are varying bit length pattern that is either 2, 4, or 8 bits (1512*b*). Extra bits 7-13 within the search elements are set as "Don't Cares". The length codes are shown in tables 1512*d*, 1512*e*. Each table 1512*d*, 1512*e* shows the binary code pattern 1512*g*, the number of extra-bits 1512*h*, the matched length parameter 1512*i*, and the payload data 1512*j*. The payload for search code 1512 is 2, 4, or 8.

Although the LZS protocol defined length code as a 2 or 4 bit pattern, in the illustrative embodiment, the codes are stored up to an 8 bit pattern. This allows for a single decode operation to decode a string with a length up to 23.

Odd markers 1502*f*, 1504*f*, 1506*f*, 1508*f* are appended to the first bit of the literal codes 1502, end marker code 1504, and distance codes 1506, 1508.

Even markers 1512*f* are appended to the first bit of the length codes 1512.

It should be appreciated that the index numbering of the search elements may vary as the index numbering presented are merely provided for illustrative purposes.

Those skilled in the art should appreciate the various mechanisms to use the index value of the search elements to output a decoded value that is consistent with the spirit of the present disclosure. The decoded value may be, for example, explicitly defined within a state of a state machine accessed based upon the index value. As further example, the decoded values may be maintained within a table that is accessed based upon the index value. Thus, the use of the index value of the search elements are not restricted to use of the functions listed above. In other embodiments of the present disclosure, any type of function or logic gate may be built in accordance with the principles of this disclosure. Also, other embodiments of the present disclosure may contain more or fewer functional capabilities than described above.

It should be further appreciated by those skilled in the art that the hardware algorithm disclosed is one example of algorithms that may be implemented in the disclosure herein. Although the disclosure discussed LZS and Deflate, the protocols are but two protocols that utilize Limpel Ziv based algorithms. The use of reconfigured circuitries is not restricted to LZS and Deflate protocol, the reconfigured circuitries may be further adapted with the method and apparatus consistent with the present disclosure to implement other Limpel Ziv and Huffman based algorithms.

While this disclosure has been particularly shown and described with references to example embodiments thereof, it will be understood by those skilled in the art that various changes in form and details may be made therein without departing from the scope of the disclosure encompassed by the appended claims.

What is claimed is:

1. A decompression engine comprising:
   an ingress port configured to receive an input data stream and a decoder configuration bit; and
   a decoder configured to decode the data stream according to one of a Lempel Ziv STAC (LZS) protocol and a Deflate protocol based upon the decoder configuration bit.

2. The decompression engine of claim 1, wherein the decoder comprises:
   a memory storing a plurality of search symbols and decoded values, the search symbols derived from the LZS protocol and the Deflate protocol, the decode values associated with the plurality of search symbols and including a plurality of length parameters, a plurality of distance parameters, and a plurality of literal values; and
   a plurality of search elements simultaneously comparing a portion of the input data stream to a portion of the search symbols to cause the output of one of the decoded values upon a match, the portion of search symbols selected to be compared to the portion of the input data stream based upon the decoder configuration bit.

3. The decompression engine of claim 2 wherein the decoder further comprises:
   a state machine determining the decoded value to output upon a match, the state machine using the matched search symbol and another portion of the input data stream determined from the matched search symbol to determine the decoded value.

4. The decompression engine of claim 2 wherein each search element comprises:
   a comparison circuit, a search buffer, and a payload data.

5. The decompression engine of claim 4 wherein each of the plurality of search elements has an index number, the decompression engine outputs the decoded value based upon the index number of the matched search element.

6. The decompression engine of claim 2 wherein the decoder further comprises:
   a Huffman decoder configured to decode a dynamic Huffman code dictionary from a portion of the input data stream, the decoded dynamic Huffman code dictionary stored as the plurality of search symbols and the plurality of decoded values.

7. The decompression engine of claim 2 wherein the search elements are tertiary content addressable memories (TCAM).

8. The decompression engine of claim 2 wherein the plurality of search elements comprises a search array, a binary marker appended to the portion of the input data stream being compared to the search elements, the binary marker differentiating the search elements within the search array.

9. The decompression engine of claim 2 wherein the plurality of search elements are configured to simultaneously compare at least twenty-two of the length values when decoding according to the LZS protocol.

10. The decompression engine of claim 2 wherein the plurality of search elements comprises comparison states, including a binary high, a binary low, and a don't care state.

11. A method comprising:
    receiving an input data stream having a plurality of input symbols; and
    decoding the input data stream by a decoder according to at least one of a Lempel Ziv STAC (LZS) protocol and a Deflate data protocol based upon a decoder configuration bit.

12. The method of claim 11 further comprising:
    loading a plurality of search symbols and decoded values, the search symbols derived from the LZS protocol and the Deflate protocol, the decode values associated with the plurality of search symbols, including a plurality of length parameters, a plurality of distance parameters, and a plurality of literal values; and
    comparing simultaneously a portion of the input data stream to a portion of the search symbols to output one of the decoded values upon a match, the portion of search symbols loaded to be compared to the portion of the input data stream based upon the decoder configuration bit.

13. The method of claim 12 further comprising:
determining the decoded value to output upon a match using the matched search symbol and another portion of the input data stream determined from the matched search symbol to determine the decoded value.

14. The method of claim 12 wherein at least twenty-two length values are compared simultaneously to a portion of the input data stream when decoding according to LZS.

15. The method of claim 14 wherein comparing simultaneously the portion of the input data stream to the portion of the search symbols is performed with a plurality of search elements.

16. The method of claim 15 wherein the search element comprises: a comparison circuit, a search buffer, and a payload data.

17. The method of claim 15 wherein the search elements are tertiary content addressable memory (TCAM).

18. The method of claim 12 wherein the search elements have an index number, the index number of the matched search element is utilized to output the decoded values.

19. The method of claim 12 further comprising
appending a binary marker to the portion of the input data stream being compared to the search elements, the binary marker differentiating the search elements within the search array.

20. A data compression engine comprising:
an input port receiving an input data stream;
a search engine determining at least one of a repetitive pattern and a non-repetitive pattern from the input data stream, the search engine outputting a string representing the repetitive pattern and a literal character representing the non-repetitive pattern; and an encoder engine receiving the literal character and the string, the encoder encoding the literal character and the string according to one of a Lempel Ziv STAC (LZS) protocol and a Deflate protocol.

* * * * *